(12) United States Patent
Zhamu et al.

(10) Patent No.: US 9,959,948 B2
(45) Date of Patent: May 1, 2018

(54) HIGHLY CONDUCTIVE GRAPHITIC FILMS

(71) Applicant: Nanotek Instruments, Inc., Dayton, OH (US)

(72) Inventors: Aruna Zhamu, Springboro, OH (US); Bor Z. Jang, Centerville, OH (US)

(73) Assignee: Nanotek Instruments, Inc., Dayton, OH (US)

( * ) Notice: Subject to any disclaimer, the term of this patent is extended or adjusted under 35 U.S.C. 154(b) by 56 days.

(21) Appl. No.: 15/170,387

(22) Filed: Jun. 1, 2016

(65) Prior Publication Data

US 2016/0358686 A1 Dec. 8, 2016

Related U.S. Application Data

(62) Division of application No. 13/999,761, filed on Mar. 20, 2014, now Pat. No. 9,359,208.

(51) Int. Cl.

| H01B 1/00 | (2006.01) |
|---|---|
| H01B 1/04 | (2006.01) |
| C09K 5/14 | (2006.01) |
| H05K 9/00 | (2006.01) |
| C01B 32/20 | (2017.01) |
| C01B 32/182 | (2017.01) |

(52) U.S. Cl.
CPC ............ H01B 1/04 (2013.01); C01B 32/182 (2017.08); C01B 32/20 (2017.08); C09K 5/14 (2013.01); H05K 9/0073 (2013.01); Y10T 428/30 (2015.01)

(58) Field of Classification Search
CPC .................................................. C04B 35/524
See application file for complete search history.

(56) References Cited

U.S. PATENT DOCUMENTS

| 2006/0035085 A1* | 2/2006 | Ozaki | B82Y 30/00 428/408 |
|---|---|---|---|
| 2008/0248275 A1* | 10/2008 | Jang | B82Y 30/00 428/220 |
| 2010/0085713 A1 | 4/2010 | Balandin et al. | |
| 2010/0140792 A1 | 6/2010 | Haddon et al. | |

(Continued)

OTHER PUBLICATIONS

U.S. Appl. No. 11/784,606, filed Apr. 7, 2007, Zhamu et al.
U.S. Appl. No. 13/999,761, filed Sep. 24, 2015, Zhamu et al.

*Primary Examiner* — Robert A Vetere

(57) ABSTRACT

A flexible graphene platelet-filled composite film comprising a carbon or graphitic matrix and 1% to 99% weight fraction of graphene platelets dispersed in the matrix, wherein the graphene platelets are aligned along planar directions of said film and are selected from pristine graphene, oxidized graphene, reduced graphene oxide, fluorinated graphene, hydrogenated graphene, doped graphene, chemically functionalized graphene, or a combination thereof, and wherein the carbon or graphitic matrix is obtained by carbonizing a carbon precursor polymer at a carbonization temperature of at least 300° C. or by carbonizing and graphitizing the carbon precursor polymer at a final graphitization temperature higher than 1,500° C., and the graphitic matrix comprises graphene layers that are substantially oriented parallel to one another with an inclination angle between two graphene layers less than 5 degrees. The film is thermally and electrically conductive, and can be used to dissipate heat in an electronic device or device housing.

12 Claims, 13 Drawing Sheets

(56) References Cited

U.S. PATENT DOCUMENTS

2010/0143798 A1\* 6/2010 Zhamu .................. H01M 4/133
　　　　　　　　　　　　　　　　　　　429/212
2011/0108978 A1　5/2011 Kim et al.

\* cited by examiner (Scale bar = 5 μm per interval)

HIGHLY CONDUCTIVE GRAPHITIC FILMS

This is a divisional of the U.S. patent application Ser. No. 13/999,761 (Mar. 20, 2014), which is now U.S. Pat. No. 9,309,208 (Jun. 7, 2016).

FIELD OF THE INVENTION

The present invention relates generally to the field of graphitic materials for electromagnetic interference (EMI) shielding and heat dissipation applications and, more particularly, to an electrically and thermally conductive graphitic film obtained from a graphene-filled polymer or carbon precursor. This graphene-polymer composite-derived film exhibits a combination of exceptionally high thermal conductivity, high electrical conductivity, and high mechanical strength.

BACKGROUND OF THE INVENTION

Advanced EMI shielding and thermal management materials are becoming critical for today's microelectronic, photonic, and photovoltaic systems. These systems require shielding against EMI from external sources, and these systems can be sources of electromagnetic interference to other sensitive electronic devices and must be shielded. Materials for EMI shielding applications must be electrically conducting.

Further, as new and more powerful chip designs and light-emitting diode (LED) systems are introduced, they consume more power and generate more heat. This has made thermal management a crucial issue in today's high performance systems. Systems ranging from active electronically scanned radar arrays, web servers, large battery packs for personal consumer electronics, wide-screen displays, and solid-state lighting devices all require high thermal conductivity materials that can dissipate heat more efficiently. On the other hand, the devices are designed and fabricated to become increasingly smaller, thinner, lighter, and tighter. This further increases the difficulty of thermal dissipation. Actually, thermal management challenges are now widely recognized as the key barriers to industry's ability to provide continued improvements in device and system performance.

Heat sinks are components that facilitate heat dissipation from the surface of a heat source, such as a CPU or battery in a computing device, to a cooler environment, such as ambient air. Typically, heat transfer between a solid surface and the air is the least efficient within the system, and the solid-air interface thus represents the greatest barrier for heat dissipation. A heat sink is designed to enhance the heat transfer efficiency between a heat source and the air mainly through increased heat sink surface area that is in direct contact with the air. This design enables a faster heat dissipation rate and thus lowers the device operating temperature.

Materials for thermal management applications (e.g. as a heat sink) must be thermally conducting. Typically, heat sinks are made from a metal, especially copper or aluminum, due to the ability of metal to readily transfer heat across its entire structure. Cu and Al heat sinks are formed with fins or other structures to increase the surface area of the heat sink, often with air being forced across or through the fins to facilitate heat dissipation of heat to the air. However, there are several major drawbacks or limitations associated with the use of metallic heat sinks. One drawback relates to the relatively low thermal conductivity of a metal (<400 W/mK for Cu and 80-200 W/mK for Al alloy). In addition, the use of copper or aluminum heat sinks can present a problem because of the weight of the metal, particularly when the heating area is significantly smaller than that of the heat sink. For instance, pure copper weighs 8.96 grams per cubic centimeter ($g/cm^3$) and pure aluminum weighs 2.70 $g/cm^3$. In many applications, several heat sinks need to be arrayed on a circuit board to dissipate heat from a variety of components on the board. If metallic heat sinks are employed, the sheer weight of the metal on the board can increase the chances of the board cracking or of other undesirable effects, and increases the weight of the component itself. Many metals do not exhibit a high surface thermal emissivity and thus do not effectively dissipate heat through the radiation mechanism.

Thus, there is a strong need for a non-metallic heat sink system effective for dissipating heat produced by a heat source such as a CPU. The heat sink system should exhibit a higher thermal conductivity and/or a higher thermal conductivity-to-weight ratio as compared to metallic heat sinks. These heat sinks must also be mass-producible, preferably using a cost-effective process. This processing ease requirement is important since metallic heat sinks can be readily produced in large quantities using scalable techniques such as extrusion, stamping, and die casting.

One group of materials potentially suitable for both EMI shielding and heat sink applications is the graphitic carbon or graphite. Carbon is known to have five unique crystalline structures, including diamond, fullerene (0-D nano graphitic material), carbon nano-tube or carbon nano-fiber (1-D nano graphitic material), graphene (2-D nano graphitic material), and graphite (3-D graphitic material). The carbon nano-tube (CNT) refers to a tubular structure grown with a single wall or multi-wall. Carbon nano-tubes (CNTs) and carbon nano-fibers (CNFs) have a diameter on the order of a few nanometers to a few hundred nanometers. Their longitudinal, hollow structures impart unique mechanical, electrical and chemical properties to the material. The CNT or CNF is a one-dimensional nano carbon or 1-D nano graphite material.

Bulk natural graphite powder is a 3-D graphitic material with each graphite particle being composed of multiple grains (a grain being a graphite single crystal or crystallite) with grain boundaries (amorphous or defect zones) demarcating neighboring graphite single crystals. Each grain is composed of multiple graphene planes that are oriented parallel to one another. A graphene plane in a graphite crystallite is composed of carbon atoms occupying a two-dimensional, hexagonal lattice. In a given grain or single crystal, the graphene planes are stacked and bonded via van der Waal forces in the crystallographic c-direction (perpendicular to the graphene plane or basal plane). Although all the graphene planes in one grain are parallel to one another, typically the graphene planes in one grain and the graphene planes in an adjacent grain are different in orientation. In other words, the orientations of the various grains in a graphite particle typically differ from one grain to another.

A graphite single crystal (crystallite) per se is anisotropic with a property measured along a direction in the basal plane (crystallographic a- or b-axis direction) being dramatically different than if measured along the crystallographic c-axis direction (thickness direction). For instance, the thermal conductivity of a graphite single crystal can be up to approximately 1,920 W/mK (theoretical) or 1,800 W/mK (experimental) in the basal plane (crystallographic a- and b-axis directions), but that along the crystallographic c-axis direction is less than 10 W/mK (typically less than 5 W/mK). Consequently, a natural graphite particle composed of multiple grains of different orientations exhibits an average property between these two extremes.

The constituent graphene planes of a graphite crystallite can be exfoliated and extracted or isolated from a graphite crystallite to obtain individual graphene sheets of carbon atoms provided the inter-planar van der Waals forces can be overcome. An isolated, individual graphene sheet of carbon atoms is commonly referred to as single-layer graphene. A stack of multiple graphene planes bonded through van der Waals forces in the thickness direction with an inter-graphene plane spacing of 0.3354 nm is commonly referred to as a multi-layer graphene. A multi-layer graphene platelet has up to 300 layers of graphene planes (<100 nm in thickness), but more typically up to 30 graphene planes (<10 nm in thickness), even more typically up to 20 graphene planes (<7 nm in thickness), and most typically up to 10 graphene planes (commonly referred to as few-layer graphene in scientific community). Single-layer graphene and multi-layer graphene sheets are collectively called "nano graphene platelets" (NGPs). Graphene sheets/platelets or NGPs are a new class of carbon nano material (a 2-D nano carbon) that is distinct from the 0-D fullerene, the 1-D CNT, and the 3-D graphite.

NGPs are typically obtained by intercalating natural graphite particles with a strong acid and/or oxidizing agent to obtain a graphite intercalation compound (GIC) or graphite oxide (GO), as illustrated in FIG. 1(A) and FIG. 1(B). The presence of chemical species or functional groups in the interstitial spaces between graphene planes serves to increase the inter-graphene spacing ($d_{002}$, as determined by X-ray diffraction), thereby significantly reducing the van der Waals forces that otherwise hold graphene planes together along the c-axis direction. The GIC or GO is most often produced by immersing natural graphite powder (20 in FIG. 1(A)) in a mixture of sulfuric acid, nitric acid (an oxidizing agent), and another oxidizing agent (e.g. potassium permanganate or sodium perchlorate). The resulting GIC (22) is actually some type of graphite oxide (GO) particles. This GIC is then repeatedly washed and rinsed in water to remove excess acids, resulting in a graphite oxide suspension or dispersion, which contains discrete and visually discernible graphite oxide particles dispersed in water. There are two processing routes to follow after this rinsing step:

Route 1 involves removing water from the suspension to obtain "expandable graphite," which is essentially a mass of dried GIC or dried graphite oxide particles. Upon exposure of expandable graphite to a temperature in the range of typically 800-1,050° C. for approximately 30 seconds to 2 minutes, the GIC undergoes a rapid expansion by a factor of 30-300 to form "graphite worms" (24), which are each a collection of exfoliated, but largely un-separated graphite flakes that remain interconnected.

In Route 1A, these graphite worms (exfoliated graphite or "networks of interconnected/non-separated graphite flakes") can be re-compressed to obtain flexible graphite sheets or foils (26) that typically have a thickness in the range of 0.1 mm (100 μm)-0.5 mm (500 μm). Alternatively, one may choose to use a low-intensity air jet mill or shearing machine to simply break up the graphite worms for the purpose of producing the so-called "expanded graphite flakes" which contain mostly graphite flakes or platelets thicker than 100 nm (hence, not a nano material by definition).

Exfoliated graphite worms, expanded graphite flakes, and the recompressed mass of graphite worms (commonly referred to as flexible graphite sheet or flexible graphite foil) are all 3-D graphitic materials that are fundamentally different and patently distinct from either the 1-D nano carbon material (CNT or CNF) or the 2-D nano carbon material (graphene sheets or platelets, NGPs). Flexible graphite (FG) foils can be used as a heat spreader material, but exhibiting a maximum in-plane thermal conductivity of typically less than 500 W/mK (more typically <300 W/mK) and in-plane electrical conductivity no greater than 1,500 S/cm. These low conductivity values are a direct result of the many defects, wrinkled or folded graphite flakes, interruptions or gaps between graphite flakes, and non-parallel flakes (e.g. SEM image in FIG. 2(B)). Many flakes are inclined with respect to one another at a very large angle (e.g. mis-orientation of 20-40 degrees).

In Route 1B, the exfoliated graphite is subjected to high-intensity mechanical shearing (e.g. using an ultrasonicator, high-shear mixer, high-intensity air jet mill, or high-energy ball mill) to form separated single-layer and multi-layer graphene sheets (collectively called NGPs, 33). Single-layer graphene can be as thin as 0.34 nm, while multi-layer graphene can have a thickness up to 100 nm. In the present application, the thickness of multi-layer NGPs is typically less than 20 nm.

Route 2 entails ultrasonicating the graphite oxide suspension for the purpose of separating/isolating individual graphene oxide sheets from graphite oxide particles. This is based on the notion that the inter-graphene plane separation bas been increased from 0.3354 nm in natural graphite to 0.6-1.1 nm in highly oxidized graphite oxide, significantly weakening the van der Waals forces that hold neighboring planes together. Ultrasonic power can be sufficient to further separate graphene plane sheets to form separated, isolated, or discrete graphene oxide (GO) sheets. These graphene oxide sheets can then be chemically or thermally reduced to obtain "reduced graphene oxides" (RGO) typically having an oxygen content of 0.001%-10% by weight, more typically 0.01%-5% by weight.

For the purpose of defining the claims of the instant application, NGPs include discrete sheets/platelets of single-layer and multi-layer versions of graphene, graphene oxide, or reduced graphene oxide with an oxygen content of 0-10% by weight, more typically 0-5% by weight, and preferably 0-2% by weight. Pristine graphene has essentially 0% oxygen. Graphene oxide (including RGO) typically has 0.001%-46% by weight of oxygen.

Flexible graphite foils may be obtained by compressing or roll-pressing exfoliated graphite worms into paper-like sheets. For electronic device thermal management applications (e.g. as a heat sink material), flexible graphite (FG) foils have the following major deficiencies:

(1) As indicated earlier, FG foils exhibit a relatively low thermal conductivity, typically <500 W/mK and more typically <300 W/mK. By impregnating the exfoliated graphite with a resin, the resulting composite exhibits an even lower thermal conductivity (typically <<200 W/mK, more typically <100 W/mK).

(2) Flexible graphite foils, without a resin impregnated therein or coated thereon, are of low strength, low rigidity, and poor structural integrity. The high tendency for flexible graphite foils to get torn apart makes them difficult to handle in the process of making a heat sink. As a matter of fact, the flexible graphite sheets (typically 50-200 μm thick) are so "flexible" that they are not sufficiently rigid to make a fin component material for a finned heat sink.

(3) Another very subtle, largely ignored or overlooked, but critically important feature of FG foils is their high tendency to get flaky with graphite flakes easily coming off from FG sheet surfaces and emitting out to other parts of a microelectronic device. These highly electrically conducting flakes (typically 1-200 μm in lateral dimensions and >100 nm in thickness) can cause internal shorting and failure of electronic devices.

Similarly, solid NGPs (including discrete sheets/platelets of pristine graphene, GO, and GRO), when packed into a film, membrane, or paper sheet (34) of non-woven aggregates, typically do not exhibit a high thermal conductivity unless these sheets/platelets are closely packed and the film/membrane/paper is ultra-thin (e.g. <1 μm, which is mechanically weak). This is reported in our earlier U.S. patent application Ser. No. 11/784,606 (Apr. 9, 2007). In general, a paper-like structure or mat made from platelets of graphene, GO, or RGO (e.g. those paper sheets prepared by vacuum-assisted filtration process) exhibit many defects, wrinkled or folded graphene sheets, interruptions or gaps between platelets, and non-parallel platelets (e.g. SEM image in FIG. 3(B)), leading to relatively poor thermal conductivity, low electric conductivity, and low structural strength. These papers or aggregates of discrete NGP, GO or RGO platelets alone (without a resin binder) also have a tendency to get flaky, emitting conductive particles into air.

Our earlier application (U.S. application Ser. No. 11/784,606) also disclosed a mat, film, or paper of NGPs infiltrated with a metal, glass, ceramic, resin, and CVD carbon matrix material (graphene sheets/platelets being the filler or reinforcement phase, not the matrix phase in this earlier application). Haddon, et al. (US Pub. No. 2010/0140792, Jun. 10, 2010) also reported NGP thin film and NGP-reinforced polymer matrix composites for thermal management applications. The NGP-reinforced polymer matrix composites, as an intended thermal interface material, have very low thermal conductivity, typically <<2 W/mK. The NGP films of Haddon, et al are essentially non-woven aggregates of discrete graphene platelets, identical to those of our earlier invention (U.S. application Ser. No. 11/784,606). Again, these aggregates have a great tendency to have graphite particles flaking and separated from the film surface, creating internal shorting problem for the electronic device containing these aggregates. They also exhibit low thermal conductivity unless made into thin films (10 nm-300 nm, as reported by Haddon, et al) which are very difficult to handle in a real device manufacturing environment. Balandin, et al (US Pub. No. 2010/0085713, Apr. 8, 2010) disclosed a graphene layer produced by CVD deposition or diamond conversion for heat spreader application. More recently, Kim, et al (N. P. Kim and J. P. Huang, "Graphene Nanoplatelet Metal Matrix," US Pub. No. 2011/0108978, May 10, 2011) reported metal matrix infiltrated NGPs. However, the metal matrix is too heavy and the resulting metal matrix composite does not exhibit a high thermal conductivity.

Another prior art material for thermal management or EMI shielding application is the pyrolytic graphite film. The lower portion of FIG. 1(A) illustrates a typical process for producing prior art pyrolitic graphite films from a polymer. The process begins with carbonizing a polymer film 46 at a carbonization temperature of 400-1,500° C. under a typical pressure of 10-15 Kg/cm$^2$ for 2-10 hours to obtain a carbonized material 48, which is followed by a graphitization treatment at 2,500-3,200° C. under an ultrahigh pressure of 100-300 Kg/cm$^2$ for 1-5 hours to form a graphitic film 50. There are several major drawbacks associated with this process for producing graphitic films:
(1) Technically, it is utmost challenging to maintain such an ultrahigh pressure (>100 Kg/cm$^2$) at such an ultrahigh temperature (>2,500° C.). The combined high temperature and high pressure conditions, even if achievable, are not cost-effective.
(2) This is a difficult, slow, tedious, energy-intensive, and very expensive process.
(3) This polymer graphitization process is not conducive to the production of either thick graphitic films (>50 μm) or very thin films (<10 μm).
(4) In general, high-quality graphitic films could not be produced with a temperature lower than 2,700° C., unless when a highly oriented polymer is used as a starting material (e.g. please see Y. Nishikawa, et al. "Filmy graphite and process for producing the same," U.S. Pat. No. 7,758,842 (Jul. 20, 2010)) or a catalytic metal is brought in contact with a highly oriented polymer during carbonization and graphitization (Y. Nishikawa, et al. "Process for producing graphite film," U.S. Pat. No. 8,105,565 (Jan. 31, 2012)). This high degree of molecular orientation, as expressed in terms of optical birefringence, is not always possible to achieve. Further, the use of a catalytic metal tends to contaminate the resulting graphite films with metallic elements.
(5) The resulting graphitic films tend to be brittle and of low mechanical strength.

A second type of pyrolytic graphite is produced by high temperature decomposition of hydrocarbon gases in vacuum followed by deposition of the carbon atoms to a substrate surface. This vapor phase condensation of cracked hydrocarbons is essentially a chemical vapor deposition (CVD) process. In particular, highly oriented pyrolytic graphite (HOPG) is the material produced by the application of uniaxial pressure on deposited pyrocarbon or pyrolytic graphite at very high temperatures (typically 3,000-3,300° C.). This entails a thermo-mechanical treatment of combined mechanical compression and ultra-high temperature for an extended period of time in a protective atmosphere; a very expensive, energy-intensive, and technically challenging process. The process requires ultra-high temperature equipment (with high vacuum, high pressure, or high compression provision) that is not only very expensive to make but also very expensive and difficult to maintain.

It is an object of the present invention to provide a process for producing graphitic films that exhibit a combination of exceptional thermal conductivity, electrical conductivity, and mechanical strength unmatched by any material of comparable thickness range.

Another object of the present invention is to provide a cost-effective process for producing a thermally conductive graphitic film from a nano graphene platelet-filled polymer or other type of carbon precursor material (e.g. pitch, monomer, oligomer, organic substance, such as maleic acid) through controlled carbonization and graphitization.

In particular, the present invention provides a process capable of producing a graphitic film from a nano graphene platelet-filled polymer or other carbon precursor material at a carbonization temperature and/or a graphitization temperature lower than the carbonization temperature and/or a graphitization temperature required of successfully producing a graphitic film of a comparable conductivity from a corresponding neat polymer alone (without nano graphene platelet, NGP).

As compared to conventional processes, this inventive process involves significantly lower heat treatment temperatures, shorter heat treatment times and lower amount of energy consumed, resulting in graphitic films that are of higher thermal conductivity, higher electrical conductivity, and higher strength.

SUMMARY OF THE INVENTION

Herein presented is a process for producing a graphitic film comprising the steps of: (a) mixing graphene platelets with a carbon precursor polymer and a liquid (e.g. water or other solvent) to obtain a suspension or slurry; (b) forming the slurry into a graphene platelet-filled precursor polymer composite film under the influence of an orientation-inducing stress field to align the graphene platelets on a solid substrate, wherein the graphene platelets occupy a weight fraction of 1% to 99% based on the total precursor polymer composite weight; (c) carbonizing the precursor polymer composite film at a carbonization temperature of 500 to 1,500° C. to obtain a carbonized composite film; and (d) thermally treating (or graphitizing) the carbonized composite film at a final graphitization temperature higher than 1,500° C. to obtain the graphitic film. The graphene platelets may be selected from pristine graphene, oxidized graphene, reduced graphene oxide, fluorinated graphene, hydrogenated graphene, doped graphene, chemically functionalized graphene, or a combination thereof, and the carbon precursor polymer is selected from the group consisting of polyimide, polyamide, polyoxadiazole, polybenzoxazole, polybenzobisoxazole, polythiazole, polybenzothiazole, polybenzobisthiazole, poly(p-phenylene vinylene), polybenzimidazole, polybenzobisimidazole, and combinations thereof.

Preferably, the process further comprises a step of compressing the carbonized composite film during or after the step (c) of carbonizing the precursor polymer composite film (e.g. via roll-pressing). In another preferred embodiment, the process further comprise a step of compressing the graphitic film during or after the step (d) of thermally treating the carbonized composite film to reduce the thickness of the film and improve in-plane properties of the film.

In one aspect of this invention, the final graphitization temperature is lower than 2,500° C., as opposed to a typical temperature greater than 2,500° C. for graphitization of carbon materials obtained by carbonization of polymers alone, such as polyimide (PI). In another aspect, the final graphitization temperature is lower than 2,000° C. This is surprising in that full graphitization of our carbonized composite could be accomplished at a temperature lower than 2,500° C., and is most surprising that this could be achieved at a temperature lower than 2,000° C. In another aspect, the carbonization temperature is lower than 1,000° C., as opposed to typically using a carbonization temperature higher than 1,000° C.

In some aspects, the graphene platelets comprise a single-layer graphene sheet (preferably) or a multi-layer graphene platelet with a thickness less than 100 nm (preferably with a thickness less than 10 nm, more preferably less than 3.5 nm or 10 graphene planes). In one preferred embodiment, the graphene platelets comprise a single-layer pristine graphene sheet or a multi-layer pristine graphene platelet with a thickness less than 10 nm. The pristine graphene sheet or pristine graphene platelet contains no oxygen and is produced from a process that does not involve oxidation and/or chemical intercalation (e.g. intercalation by a strong acid, such as sulfuric acid and/or nitric acid).

In an aspect of the instant invention, the carbonization temperature and/or the final graphitization temperature for obtaining the graphitic film from the graphene platelet-filled carbon precursor polymer composite is lower than the carbonization temperature and/or the final graphitization temperature required of producing a graphitic film from the carbon precursor polymer alone without an added graphene platelet, given the same degree of graphitization or the same or similar properties exhibited by the films.

In a further aspect, the carbonization temperature for carbonizing the graphene platelet-filled precursor polymer composite is lower than 1,000° C. and the carbonization temperature required for the polymer alone (having a comparable conductivity value) is higher than 1,000° C. In still another aspect, the final graphitization temperature for producing the graphitic film from the graphene platelet-filled carbon precursor polymer composite is lower than 2,500° C. and the required final graphitization temperature from the polymer alone (having a comparable conductivity value of resulting graphitic film) is higher than 2,500° C.

Another preferred embodiment of the present invention is a process for producing a graphitic film comprising the steps of: (a) mixing graphene platelets with a carbon precursor material (e.g. a polymer, organic material, coal tar pitch, petroleum pitch, etc.) and a liquid to form a slurry or suspension and forming the resulting slurry or suspension into a wet film under the influence of an orientation-inducing stress field to align the graphene platelets (e.g. via casting or coating a thin film on a surface of a solid substrate, such as a polyethylene terephthalate film, PET); (b) removing the liquid component to form a graphene platelet-filled precursor composite film wherein the graphene platelets occupy a weight fraction of 1% to 99% based on the total precursor composite weight; (c) carbonizing the precursor composite film at a carbonization temperature of 500 to 1,500° C. to obtain a carbonized composite film; and (d) thermally treating the carbonized composite film at a final graphitization temperature higher than 1,500° C. to obtain the graphitic film; wherein the graphene platelets are selected from pristine graphene, oxidized graphene, reduced graphene oxide, fluorinated graphene, hydrogenated graphene, doped graphene, chemically functionalized graphene, or a combination thereof, and the carbon precursor material has a carbon yield of less than 70%.

In one aspect, the carbon precursor material has a carbon yield of less than 50%. In another aspect, the carbon precursor material has a carbon yield of less than 30%. It is surprising to observe that with a high loading of graphene sheets or platelets dispersed in a precursor matrix material we could obtain an essentially fully graphitized graphitic film even though the matrix material has a low carbon yield (e.g. lower than 50% or even lower than 30%; i.e. losing 50% or 70% of substance during carbonization). It has not been possible for the graphitic films to be obtained from a precursor material having a low carbon yield, such as lower than 30%.

The inventive process is typically conducted in such a manner that the resulting graphene platelet-filled carbon precursor polymer composite film, prior to the carbonization treatment, exhibits an optical birefringence less than 1.4. In one aspect, the optical birefringence is less than 1.2.

In one aspect of the invention, the final graphitization temperature is less than 2,000° C. and the resulting graphitic film has an inter-graphene spacing less than 0.338 nm, a thermal conductivity of at least 1,000 W/mK, and/or an electrical conductivity no less than 5,000 S/cm. In another aspect, the final graphitization temperature is less than 2,200° C. and the graphitic film has an inter-graphene spacing less than 0.337 nm, a thermal conductivity of at least 1,200 W/mK, an electrical conductivity no less than 7,000 S/cm, a physical density greater than 1.9 g/cm3, and/or a tensile strength greater than 25 MPa. In still another aspect, the final graphitization temperature is less than 2,500° C. and the resulting graphitic film has an inter-graphene spacing less than 0.336 nm, a thermal conductivity of at least 1,500 W/mK, an electrical conductivity no less than 10,000 S/cm, a physical density greater than 2.0 g/cm$^3$, and/or a tensile strength greater than 30 MPa.

Preferably, the graphitic film exhibits an inter-graphene spacing less than 0.337 nm and a mosaic spread value less than 1.0. More preferably, the graphitic film exhibits a degree of graphitization no less than 60% and/or a mosaic spread value less than 0.7. Most preferably, the graphitic film exhibits a degree of graphitization no less than 90% and/or a mosaic spread value less than 0.4.

The invention also provides a process for producing a graphitic film comprising the steps of (a) mixing expanded graphite flakes (having a flake thickness greater than 100 nm) with a carbon precursor material and a liquid to form a slurry and forming the slurry into a wet film under the influence of an orientation-inducing stress field to align the expanded graphite flakes; (b) removing the liquid to form an expanded graphite flake-filled precursor composite film wherein the expanded graphite flakes occupy a weight fraction of 1% to 99% based on the total precursor composite weight; (c) carbonizing the precursor composite film at a carbonization temperature of 300 to 1,500° C. to obtain a carbonized composite film; and (d) thermally treating the carbonized composite film at a final graphitization temperature higher than 1,500° C. to obtain the graphitic film. The carbon precursor material can be a monomer, an oligomer, a low molecular weight organic material (e.g. maleic acid, carboxylic acid, etc.), or a polymer. For a thermosetting polymer, it is the monomer or oligomer version of the polymer that can be dissolved in a liquid solvent. Preferably, the carbon precursor material is selected from the group consisting of polyimide, polyamide, polyoxadiazole, polybenzoxazole, polybenzobisoxazole, polythiazole, polybenzothiazole, polybenzobisthiazole, poly(p-phenylene vinylene), polybenzimidazole, polybenzobisimidazole, poly(furfuryl alcohol), phenolic resin, polyacrylonitrile (PAN), and combinations thereof The present invention also provides a graphitic film produced by any one of the processes as herein defined. Another embodiment of the present invention is an electronic device containing a graphitic film as a heat-dissipating element therein.

DESCRIPTION OF THE PREFERRED EMBODIMENTS

Figure 1A:
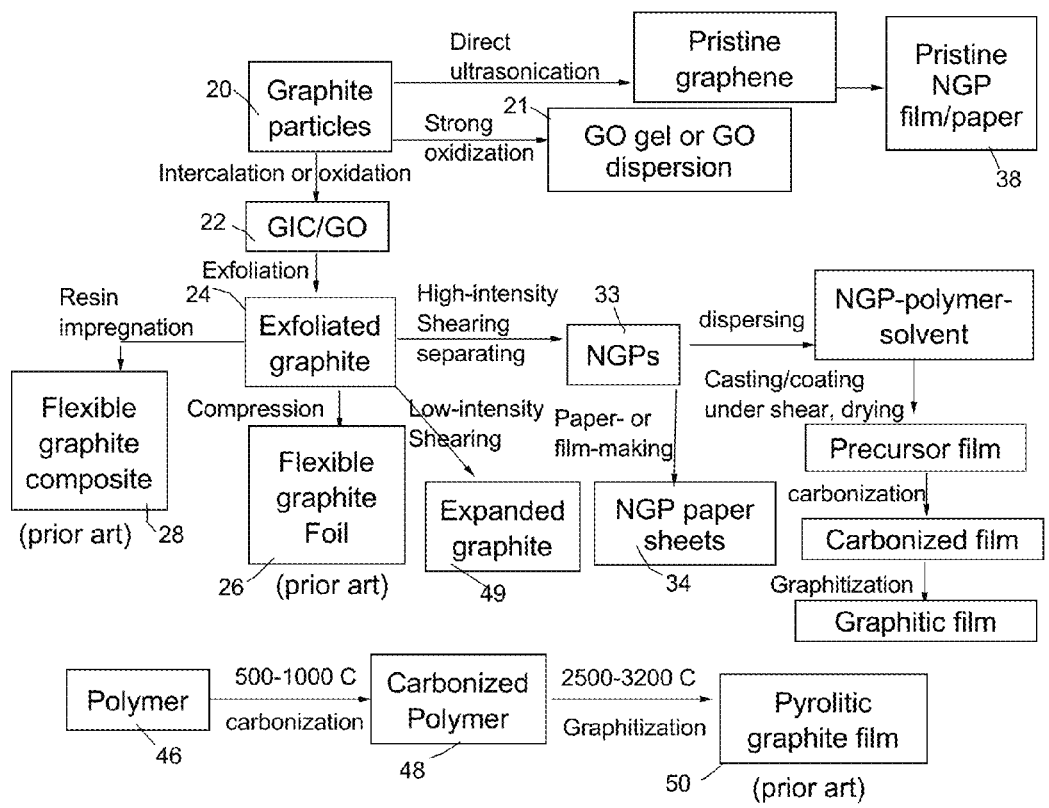
FIG. 1(A) A flow chart illustrating various prior art processes of producing exfoliated graphite products (flexible graphite foils and flexible graphite composites) and pyrolytic graphite (bottom portion)

The invention provides a process for producing a highly conductive graphitic film. The process comprises the steps of:
(a) mixing graphene platelets with a carbon precursor material (e.g. a polymer) and a liquid (e.g. water or other solvent) to obtain a suspension or slurry;
(b) forming the slurry into a graphene platelet-filled precursor polymer composite film under the influence of an orientation-inducing stress field to align the graphene platelets on a solid substrate, wherein the graphene platelets occupy a weight fraction of 1% to 99% based on the total precursor polymer composite weight;
(c) carbonizing the precursor polymer composite film at a carbonization temperature of typically from 300 to 1,500° C. to obtain a carbonized composite film; and
(d) thermally treating (or graphitizing) the carbonized composite film at a final graphitization temperature higher than 1,500° C. to obtain the graphitic film. The graphene platelets may be selected from pristine graphene, oxidized graphene, reduced graphene oxide, fluorinated graphene, hydrogenated graphene, doped graphene, chemically functionalized graphene, or a combination thereof. The carbon precursor material is preferably a polymer selected from the group consisting of polyimide, polyamide, polyoxadiazole, polybenzoxazole, polybenzobisoxazole, polythiazole, polybenzothiazole, polybenzobisthiazole, poly(p-phenylene vinylene), polybenzimidazole, polybenzobisimidazole, and combinations thereof. The carbon precursor material can be The mixing step or Step (a) can be accomplished by dissolving a polymer (or its monomer or oligomer) in a solvent to form a solution and then dispersing graphene platelets or sheets in the solution to form a suspension or slurry. Typically, the polymer is in the amount of 0.1%-40% by weight in the polymer-solvent solution prior to mixing with graphene sheets. The graphene sheets may occupy 1% to 90% (more typically 10% to 90% and most desirably 50%-90%) by weight of the slurry.

The film-forming step or Step (b) can be conducted by casting or coating the slurry into a thin film on a solid substrate such as PET film. The casting or coating procedure must include the application of a stress, typically containing a shear stress component, for the purpose of orienting the graphene sheets/platelets parallel to the thin film plane. In a casting procedure, this shear stress can be induced by running a casting guide (a "Doctor's blade") over the cast slurry to form a thin film of desired thickness. In a coating procedure, the shear stress may be created by extruding the dispensed slurry through a coating die over the supporting PET substrate. Advantageously, the coating process can be a continuous, roll-to-roll process that is fully automated. The cast or coated film is initially in a wet state and the liquid component is substantially removed after coating or casting.

Step (c) basically entails thermally converting the precursor material (e.g. polymer or organic material) of the composite film into a carbon matrix so that the resulting film is a graphene sheet-reinforced carbon matrix composite. A preferred group of carbon precursor materials contains polyimide (PI), polyamide, polyoxadiazole, polybenzoxazole, polybenzobisoxazole, polythiazole, polybenzothiazole, polybenzobisthiazole, poly(p-phenylene vinylene), polybenzimidazole, and polybenzobisimidazole. These polymers typically have a high carbon yield, having 50%-75% by weight of the material being converted into carbon. The carbonized versions of these polymers are capable of readily forming some aromatic or benzene ring-like structures that are amenable to subsequent graphitization.

Quite unexpectedly, the presence of graphene platelets/sheets enables the carbonized versions of these aromatic polymers to be successfully graphitized at a significantly lower graphitization temperature than these polymers alone (without the help from NGPs). Further, the discrete graphene sheets themselves also cannot be graphitized unless an extremely high temperature is involved. The co-existence of graphene sheets and the carbonized versions of these polymers provides synergistic effects, enabling a reduction in graphitization temperature typically by 100-500 degrees C. and the resulting graphitic films often exhibit properties (e.g. conductivity) that are higher than those that can be achieved by either component alone. The graphene sheets appear to serve as preferential nucleation sites for graphite crystals.

Another surprising observation is that many other organic materials that are not known to be amenable to the formation of graphitic films or to graphitization can be successfully used as a carbon precursor material to work with graphene sheets/platelets. These include, for instance, monomers or oligomers of the above-cited polymers (e.g. polyamic acid, a precursor to PI), low-carbon yield polymers (e.g. polyethylene oxide, polyvinyl chloride, epoxy resin, etc.), high-carbon yield polymers (e.g. phenolic resin), low molecular weight organic materials (e.g. maleic acid, naphthalene, etc.), and pitch (e.g. petroleum pitch, coal tar pitch, mesophase pitch, heavy oil, etc.). The presence of graphene sheets appears to make some presumably low carbon-yield materials exhibit a higher carbon yield and make some previously non-graphitizable materials now graphitizable.

Most surprising is the observation that the graphite crystallites that are derived from the carbonized precursor appear to be fully integrated with the pre-existing graphene sheets to seamlessly form a nearly perfect graphitic structure. No distinction can be identified between the original graphene sheets and the graphite crystallites that are formed through carbonization and graphitization of the precursor material. One simply cannot tell if certain graphite crystals are from the original graphene sheets or from the subsequently graphitized precursor material. In contrast to the many gaps or voids in a structure of overlapped or aggregated graphene sheets that are obtained by heat treating without the presence of a carbon precursor material (resulting in a physical density typically $\ll 1.8$ g/cm$^3$), the presently invented graphitic film does not show any identifiable gaps and the physical density of the film can reach 2.25 g/cm$^3$, close to the theoretical density of graphite. These observations were made through X-ray diffraction, SEM and TEM studies.

Preferably, the process further comprises a step of compressing the carbonized composite film during or after the step (c) of carbonizing the precursor polymer composite film (e.g. via roll-pressing). Quite unexpectedly, this post-carbonization compression leads to better in-plane properties of the resulting graphitic films (e.g. significantly higher thermal conductivity and electrical conductivity). In another preferred embodiment, the process further comprise a step of compressing the graphitic film during or after the step (d) of thermally treating (graphitizing) the carbonized composite film to reduce the thickness of the film and improve in-plane properties of the film.

The graphene-precursor composite film is subjected to a properly programmed heat treatment that can be divided into two distinct heat treatment temperature (HTT) regimes:

(1) Carbonization Regime (typically 350° C.-1,500° C.): In this regime, the precursor material is carbonized to remove most of the non-carbon elements (e.g. H, O, N, etc.) and to form some incipient aromatic structure or minute graphene domains within the precursor material region. These minute graphene domains are nucleated preferentially at the pre-existing graphene sheets/platelets, which seem to serve as a heterogeneous nucleation sites for new graphite crystals.

(2) Graphitization Regime (Typically 1,500° C.-3,000° C.): In this regime, nucleation of additional graphite crystals and growth of graphite crystals occur concurrently. The graphite crystals originally nucleated from the edges or surfaces of pre-existing graphene sheets or platelets serve to bridge the gaps between graphene sheets or platelets and all the graphite crystals, old and new, are essentially integrated together. This implies that some graphitization has already begun at a temperature as low as 1,500-2,000° C., in stark contrast to conventional graphitizable materials (such as carbonized polyimide film without the co-existence of graphene sheets) that typically require a temperature as high as 2,500° C. to initiate graphitization. This is another distinct feature of the presently invented graphene-derived graphitic film material and its production processes. These merging and linking reactions result in an increase in in-plane thermal conductivity of a thin film to 1,400-1,700 W/mK, and/or in-plane electrical conductivity to 5,000-15,000 S/cm.

This Graphitization Regime, if at the higher end of the temperature range (>2,500° C.), can induce re-crystallization and perfection of graphite structures. Extensive movement and elimination of grain boundaries and other defects can occur, resulting in the formation of perfect or nearly perfect crystals. Typically, the structure contain mostly poly-crystalline graphene crystals with incomplete grain boundaries or huge grains (these grains can be orders of magnitude larger than the original grain sizes of the starting graphite particles used for producing graphene sheets. Quite interestingly, the graphene poly-crystal has all the graphene planes being closely packed and bonded and all aligned along one direction, a perfect orientation. Such a perfectly oriented structure cannot be formed with the HOPG without being subjected concurrently to an ultra-high temperature (3,200-3,400° C.) under an ultra-high pressure (300 Kg/cm$^2$). The presently invented graphitic films can achieve such a highest degree of perfection with a significantly lower temperature and much lower pressure (e.g. ambient pressure).

For the purpose of characterizing the structure of graphitic films, X-ray diffraction patterns were obtained with an X-ray diffractometer by the use of CuKcv radiation. The peak shift and broadening due to the diffractometer were calibrated using a silicon powder standard. The degree of graphitization, g, was calculated from the X-ray pattern using Mering's Eq, $d_{002}=0.3354 g+0.344 (1-g)$, where $d_{002}$ is the interlayer spacing of graphite or graphene crystal in nm. This equation is valid only when $d_{002}$ is equal or less than approximately 0.3440 nm.

Another structural index that can be used to characterize the degree of ordering of the presently invented graphitic film derived from a graphene-reinforced precursor material or related graphite crystals is the "mosaic spread," which is expressed by the full width at half maximum of an X-ray diffraction intensity curve representing the (002) or (004) reflection. This degree of ordering characterizes the graphite crystal size (or grain size), amounts of grain boundaries and other defects, and the degree of preferred grain orientation. A nearly perfect single crystal of graphite is characterized by having a mosaic spread value of 0.2-0.4. Most of our graphitic films have a mosaic spread value in this range of 0.2-0.4 (when obtained with a heat treatment temperature no less than 2,500° C.). However, some values are in the range of 0.4-0.7 if the highest heat treatment temperature (TTT) is between 2,200 and 2,500° C., and in the range of 0.7-1.0 if the highest TTT is between 2,000 and 2,200° C.

A particle of natural or artificial graphite is typically composed of multiple graphite crystallites or grains. A graphite crystallite is made up of layer planes of hexagonal networks of carbon atoms. These layer planes of hexagonally arranged carbon atoms are substantially flat and are oriented or ordered so as to be substantially parallel and equidistant to one another in a particular crystallite. These layers of hexagonal-structured carbon atoms, commonly referred to as graphene layers or basal planes, are weakly bonded together in their thickness direction (crystallographic c-axis direction) by weak van der Waals forces and groups of these graphene layers are arranged in crystallites. The graphite crystallite structure is usually characterized in terms of two axes or directions: the c-axis direction and the a-axis (or b-axis) direction. The c-axis is the direction perpendicular to the basal planes. The a- or b-axes are the directions parallel to the basal planes (perpendicular to the c-axis direction).

A highly ordered graphite particle can consist of crystallites of a considerable size, having a length of $L_a$ along the crystallographic a-axis direction, a width of $L_b$ along the crystallographic b-axis direction, and a thickness $L_c$ along the crystallographic c-axis direction. The constituent graphene planes of a crystallite are highly aligned or oriented with respect to each other and, hence, these anisotropic structures give rise to many properties that are highly directional. For instance, the thermal and electrical conductivity of a crystallite are of great magnitude along the plane directions (a- or b-axis directions), but relatively low in the perpendicular direction (c-axis). As illustrated in the upper-left portion of FIG. 1(B), different crystallites in a graphite particle are typically oriented in different directions and, hence, a particular property of a multi-crystallite graphite particle is the directional average value of all the constituent crystallites.

Due to the weak van der Waals forces holding the parallel graphene layers, natural graphite can be treated so that the spacing between the graphene layers can be appreciably opened up so as to provide a marked expansion in the c-axis direction, and thus form an expanded graphite structure in which the laminar character of the carbon layers is substantially retained. The process for manufacturing flexible graphite is well-known in the art. In general, flakes of natural graphite (e.g. 100 in FIG. 1(B)) are intercalated in an acid solution to produce graphite intercalation compounds (GICs, 102). The GICs are washed, dried, and then exfoliated by exposure to a high temperature for a short period of time. This causes the flakes to expand or exfoliate in the c-axis direction of the graphite up to 80-300 times of their original dimensions. The exfoliated graphite flakes are vermiform in appearance and, hence, are commonly referred to as worms 104. These worms of graphite flakes which have been greatly expanded can be formed without the use of a binder into cohesive or integrated sheets of expanded graphite, e.g. webs, papers, strips, tapes, foils, mats or the like (typically referred to as "flexible graphite" 106) having a typical density of about 0.04-2.0 g/cm$^3$ for most applications.

Figure 2A:
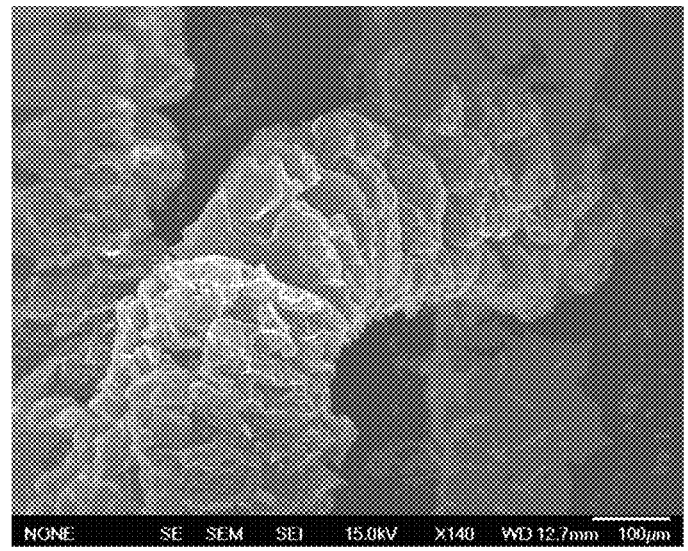
FIG. 2(A) A SEM image of a graphite worm sample after thermal exfoliation of graphite intercalation compounds (GICs) or graphite oxide powders.

The upper left portion of FIG. 1(A) shows a flow chart that illustrates the prior art processes used to fabricate flexible graphite foils and the resin-impregnated flexible graphite composite. The processes typically begin with intercalating graphite particles 20 (e.g., natural graphite or synthetic graphite) with an intercalant (typically a strong acid or acid mixture) to obtain a graphite intercalation compound 22 (GIC). After rinsing in water to remove excess acid, the GIC becomes "expandable graphite." The GIC or expandable graphite is then exposed to a high temperature environment (e.g., in a tube furnace preset at a temperature in the range of 800-1,050° C.) for a short duration of time (typically from 15 seconds to 2 minutes). This thermal treatment allows the graphite to expand in its c-axis direction by a factor of 30 to several hundreds to obtain a worm-like vermicular structure 24 (graphite worm), which contains exfoliated, but un-separated graphite flakes with large pores interposed between these interconnected flakes. An example of graphite worms is presented in FIG. 2(A).

Figure 1B:
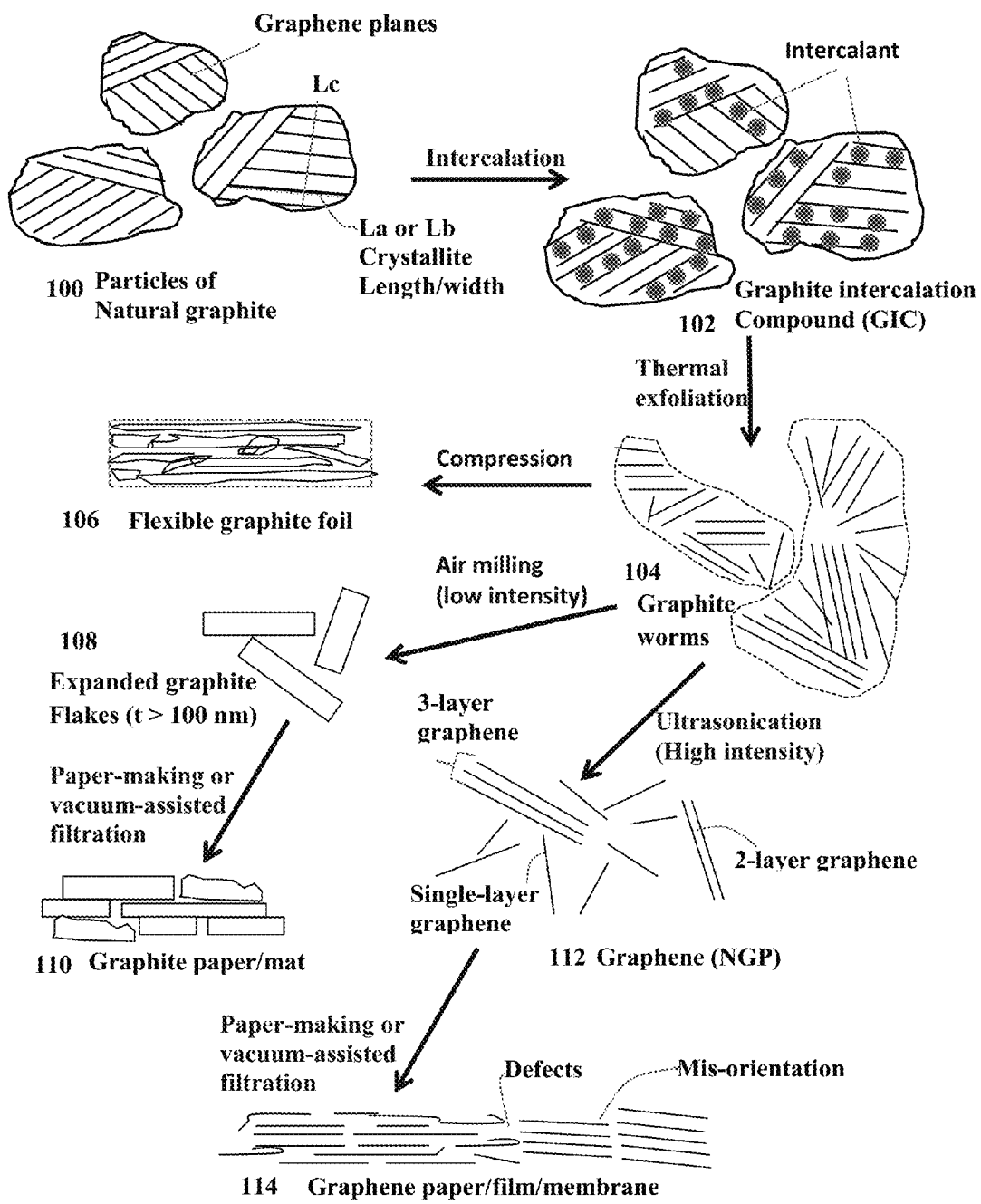
FIG. 1(B) Schematic drawing illustrating the processes for producing paper, mat, film, and membrane of simply aggregated graphite or NGP flakes/platelets. All processes begin with intercalation and/or oxidation treatment of graphitic materials (e.g. natural graphite particles).
Figure 2B:
FIG. 2(B) An SEM image of a cross-section of a flexible graphite foil, showing many graphite flakes with orientations not parallel to the flexible graphite foil surface and also showing many defects, kinked or folded flakes.

In one prior art process, the exfoliated graphite (or mass of graphite worms) is re-compressed by using a calendaring or roll-pressing technique to obtain flexible graphite foils (26 in FIG. 1(A) or 106 in FIG. 1(B)), which are typically much thicker than 100 μm. An SEM image of a cross-section of a flexible graphite foil is presented in FIG. 2(B), which shows many graphite flakes with orientations not parallel to the flexible graphite foil surface and there are many defects and imperfections.

Largely due to these mis-orientations of graphite flakes and the presence of defects, commercially available flexible graphite foils normally have an in-plane electrical conductivity of 1,000-3,000 S/cm, through-plane (thickness-direction or Z-direction) electrical conductivity of 15-30 S/cm, in-plane thermal conductivity of 140-300 W/mK, and through-plane thermal conductivity of approximately 10-30 W/mK. These defects and mis-orientations are also responsible for the low mechanical strength (e.g. defects are potential stress concentration sites where cracks are preferentially initiated). These properties are inadequate for many thermal management applications and the present invention is made to address these issues.

In another prior art process, the exfoliated graphite worm 24 may be impregnated with a resin and then compressed and cured to form a flexible graphite composite 28, which is normally of low strength as well. In addition, upon resin impregnation, the electrical and thermal conductivity of the graphite worms could be reduced by two orders of magnitude. Even with subsequent heat treatments, the electrical and thermal conductivity values remain very low, even lower than those of corresponding flexible graphite sheets without resin impregnation.

Alternatively, the exfoliated graphite may be subjected to high-intensity mechanical shearing/separation treatments using a high-intensity air jet mill, high-intensity ball mill, or ultrasonic device to produce separated nano graphene platelets 33 (NGPs) with all the graphene platelets thinner than 100 nm, mostly thinner than 10 nm, and, in many cases, being single-layer graphene (also illustrated as 112 in FIG. 1(B). An NGP is composed of a graphene sheet or a plurality of graphene sheets with each sheet being a two-dimensional, hexagonal structure of carbon atoms. The NGPs thus produced may be subjected to fluorine gas or hydrogen gas for the production of fluorinated graphene or hydrogenated graphene, for instance. Alternatively, fluorinated graphene may be obtained by producing graphite fluoride (commercially available) and then ultrasonicating graphite fluoride particles in a suspension form.

Further alternatively, with a low-intensity shearing, graphite worms tend to be separated into the so-called expanded graphite flakes (108 in FIG. 1(B) having a thickness>100 nm. These flakes can be formed into graphite paper or mat 110 using a paper- or mat-making process. This expanded graphite paper or mat 110 is just a simple aggregate or stack of discrete flakes having defects, interruptions, and mis-orientations between these discrete flakes.

Figure 3A:
FIG. 3(A) A SEM image of a graphitic film derived from graphene sheet-PI composite.
Figure 3A:
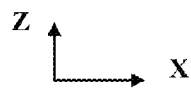
Figure 3B:
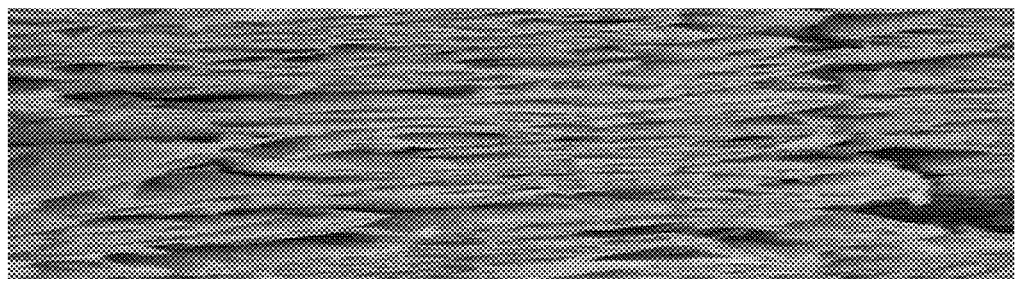
FIG. 3(B) A SEM image of a cross-section of a graphene paper/film prepared from discrete graphene sheets/platelets using a paper-making process (e.g. vacuum-assisted filtration). The image shows many discrete graphene sheets being folded or interrupted (not integrated), with orientations not parallel to the film/paper surface and having many defects or imperfections.
Figure 3B:
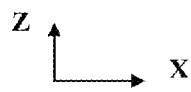

A mass of multiple NGPs (including discrete sheets/platelets of single-layer and/or few-layer graphene, 33 in FIG. 1(A)) may be made into a graphene film/paper (34 in FIG. 1(A) or 114 in FIG. 1(A)) using a film- or paper-making process. FIG. 3(B) shows a SEM image of a cross-section of a graphene paper/film prepared from discrete graphene sheets using a paper-making process. The image shows the presence of many discrete graphene sheets being folded or interrupted (not integrated), most of platelet orientations being not parallel to the film/paper surface, the existence of many defects or imperfections. NGP aggregates, even when being closely packed, typically do not exhibit a thermal conductivity higher than 600 W/mK.

The starting graphitic material to be oxidized or intercalated for the purpose of forming GO or GIC as a precursor to NGPs may be selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. The graphitic material is preferably in a powder or short filament form having a dimension lower than 20 µm, more preferably lower than 10 µm, further preferably smaller than 5 µm, and most preferably smaller than 1 µm.

If the graphene sheets are obtained from a starting graphitic material having an original graphite grain size (e.g. an average grain size, $D_g$), the resulting graphene sheets typically have an average length less than $D_g$. In contrast, the graphitic film obtained from graphene sheet-added precursor material is normally a poly-crystalline graphene structure having a grain size significantly larger than this original grain size $D_g$. The graphitic film does not have any grain that can be associated with any particular particle of the starting graphitic material used to produce graphene sheets. Original graphene sheets have already completely lost their identity when they are merged or integrated with the graphitic domains derived from the carbon precursor material or with graphene planes from other grains.

Further, even if graphene sheets are obtained from a graphitic material having multiple graphite crystallites exhibiting no preferred crystalline orientation (e.g. powder of natural graphite) as determined by an X-ray diffraction method, the resulting graphitic film (a poly-crystal graphene structure) typically exhibits a very high degree of preferred crystalline orientation as determined by the same X-ray diffraction method. This is yet another piece of evidence to indicate that the constituent graphene planes of hexagonal carbon atoms that constitute the particles of the original or starting graphitic material have been chemically modified, exfoliated, re-arranged, re-oriented, merged, and integrated with the graphitic domains derived from the carbon precursor material.

The following examples are presented to illustrate the best modes of practicing the instant invention, and not to be construed as limiting the scope of the instant invention:

Example 1: Preparation of Discrete Nano Graphene Platelets (NGPs) and Expanded Graphite Flakes Natural graphite powder with an average lateral dimension of 45 µm was used as a starting material, which was immersed in a mixture of concentrated sulfuric acid, nitric acid, and potassium permanganate (as the chemical intercalate and oxidizer) to prepare graphite intercalation compounds (GICs). The starting material was first dried in a vacuum oven for 24 h at 80° C. Then, a mixture of concentrated sulfuric acid, fuming nitric acid, and potassium permanganate (at a weight ratio of 4:1:0.05) was slowly added, under appropriate cooling and stirring, to a three-neck flask containing fiber segments. After 16 hours of reaction, the acid-treated natural graphite particles were filtered and washed thoroughly with deionized water until the pH level of the solution reached 4.0. After being dried at 100° C. overnight, the resulting graphite intercalation compound (GIC) was subjected to a thermal shock at 1050° C. for 45 seconds in a tube furnace to form exfoliated graphite (or graphite worms).

Five grams of the resulting exfoliated graphite (graphite worms) were mixed with 2,000 ml alcohol solution consisting of alcohol and distilled water with a ratio of 65:35 for 2 hours to obtain a suspension. Then the mixture or suspension was subjected to ultrasonic irradiation with a power of 200 W for various times. After two intermittent sonication treatments each of 1.5 hours, EG particles were effectively fragmented into thin NGPs. The suspension was then filtered and dried at 80° C. to remove residue solvents. The as-prepared NGPs (thermally reduced GO) have an average thickness of approximately 3.4 nm.

Another five grams of the resulting exfoliated graphite worms were subjected to low-intensity air jet milling to break up graphite worms, forming expanded graphite flakes (having an average thickness of 139 nm).

Example 2: Preparation of Single-Layer Graphene Sheets from Meso-Carbon Micro-Beads (MCMBs)

Meso-carbon microbeads (MCMBs) were supplied from China Steel Chemical Co. This material has a density of about 2.24 g/cm$^3$ with a median particle size of about 16 μm. MCMB (10 grams) were intercalated with an acid solution (sulfuric acid, nitric acid, and potassium permanganate at a ratio of 4:1:0.05) for 72 hours. Upon completion of the reaction, the mixture was poured into deionized water and filtered. The intercalated MCMBs were repeatedly washed in a 5% solution of HCl to remove most of the sulphate ions. The sample was then washed repeatedly with deionized water until the pH of the filtrate was neutral. The slurry was dried and stored in a vacuum oven at 60° C. for 24 hours. The dried powder sample was placed in a quartz tube and inserted into a horizontal tube furnace pre-set at a desired temperature, 1,080° C. for 45 seconds to obtain a graphene material. TEM and atomic force microscopic studies indicate that most of the NGPs were single-layer graphene.

Example 3: Preparation of Pristine Graphene Sheets/Platelets

In a typical procedure, five grams of graphite flakes, ground to approximately 20 μm or less in sizes, were dispersed in 1,000 mL of deionized water (containing 0.1% by weight of a dispersing agent, Zonyl® FSO from DuPont) to obtain a suspension. An ultrasonic energy level of 85 W (Branson 5450 Ultrasonicator) was used for exfoliation, separation, and size reduction of graphene sheets for a period of 15 minutes to 2 hours.

Example 4: Preparation of Polybenzoxazole (PBO) Films, NGP-PBO Films, and Expanded Graphite Flake-PBO Films Polybenzoxazole (PBO) films were prepared via casting and thermal conversion from its precursor, methoxy-containing polyaramide (MeO-PA). Specifically, monomers of 4,4'-diamino-3,3'-dimethoxydiphenyl (DMOBPA), and isophthaloyl dichloride (IPC) were selected to synthesize PBO precursors, methoxy-containing polyaramide (MeO-PA) solution. This MeO-PA solution for casting was prepared by polycondensation of DMOBPA and IPC in DMAc solution in the presence of pyridine and LiCl at −5° C. for 2 hr, yielding a 20 wt % pale yellow transparent MeO-PA solution. The inherent viscosity of the resultant MeO-PA solution was 1.20 dL/g measured at a concentration of 0.50 g/dl at 25° C. This MeO-PA solution was diluted to a concentration of 15 wt % by DMAc for casting.

Figure 4:
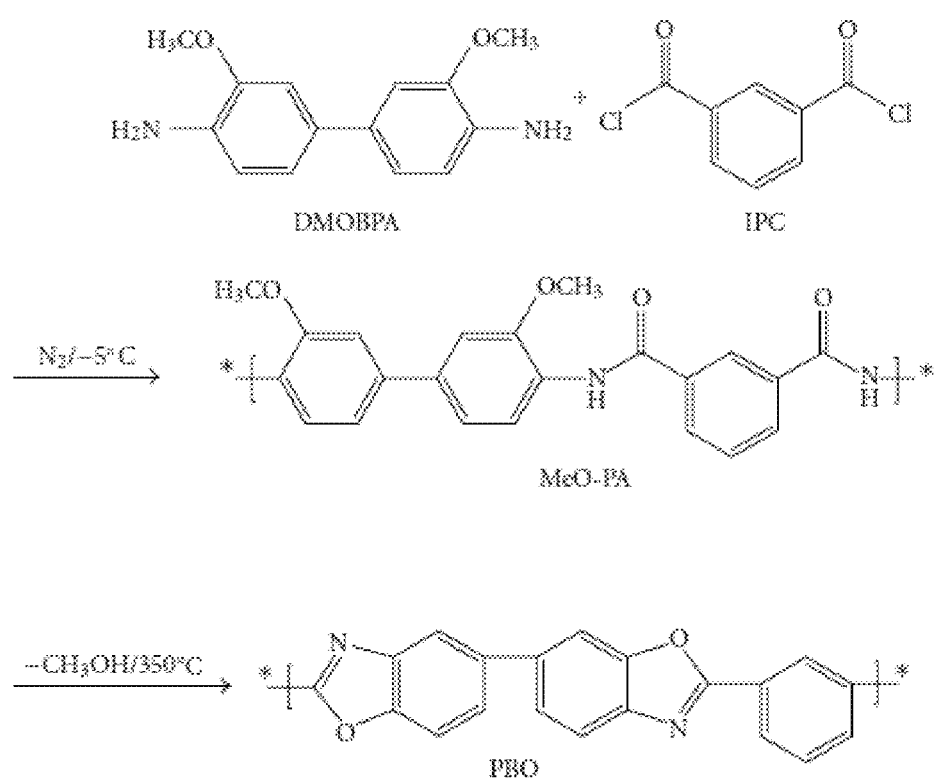
FIG. 4 Chemical reactions associated with production of PBO.

The as-synthesized MeO-PA was cast onto a glass surface to form thin films (35-120 μm) under a shearing condition. The cast film was dried in a vacuum oven at 100° C. for 4 hr to remove the residual solvent. Then, the resulting film with thickness of approximately 28-100 μm was treated at 200° C.-350° C. under $N_2$ atmosphere in three steps and annealed for about 2 hr at each step. This heat treatment serves to thermally convert MeO-PA into PBO films. The chemical reactions involved may be illustrated in FIG. 4. For comparison, both NGP-PBO and expanded graphite flake-PBO films were made under similar conditions. The NGP or EP flake proportions were varied from 10% to 90% by weight.

All the films prepared were pressed between two plates of alumina while being heat-treated (carbonized) under a 3-sccm argon gas flow in three steps: from room temperature to 600° C. in 1 h, from 600 to 1,000° C. in 1.5 h, and maintained at 1,000° C. for 1 h. The carbonized films were then roll-pressed in a pair of rollers to reduce the thickness by approximately 40%. The roll-pressed films were then subjected to graphitization treatments at 2,200° C. for 5 hours, followed by another round of roll-pressing to reduce the thickness by typically 20-40%.

Figure 5A:
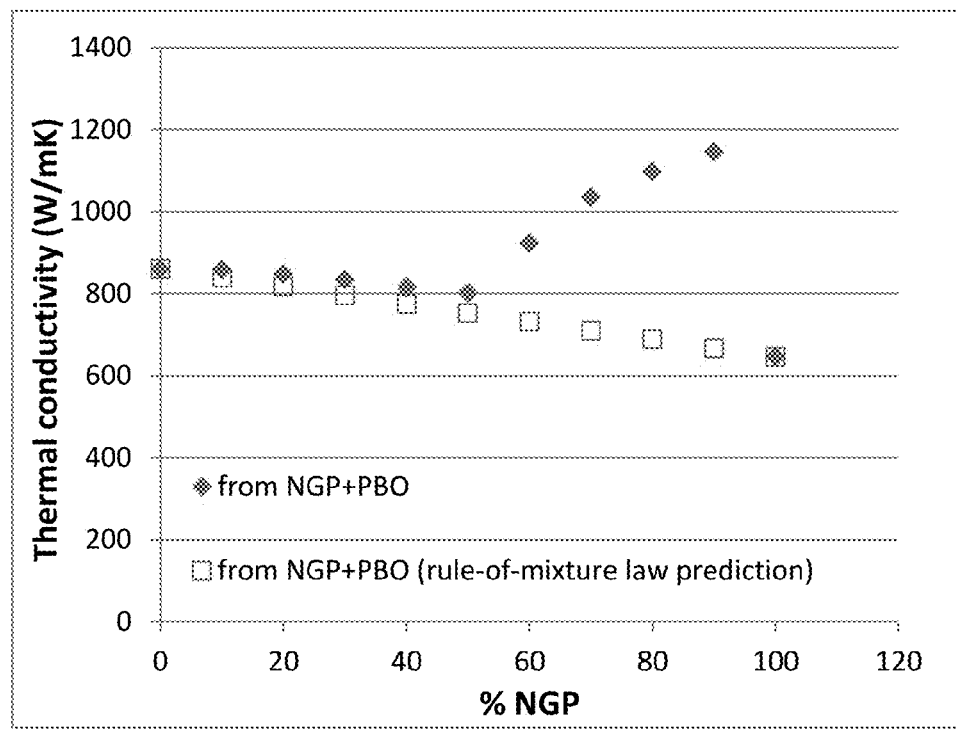
FIG. 5(A) The thermal conductivity values of a series of graphitic films derived from NGP-PBO films of various weight fractions of NGPs (from 0% to 100%)

The thermal conductivity values of a series of graphitic films derived from NGP-PBO films of various NGP weight fractions (from 0% to 100%) are summarized in FIG. 5(A). Also plotted therein is a curve of thermal conductivity ($K_c$) according to the predictions of a rule-of-mixture law commonly used to predict the property of a composite consisting of two components A and B having thermal conductivity of $K_A$ and $K_B$, respectively:

$$K_c = w_A K_A + w_B K_B,$$

Where $w_A$=weight fraction of component A and $w_B$=weight fraction of component B, and $w_A+w_B=1$. In the present case, $w_B$=weight fraction of NGPs, varying from 0% to 100%. The sample containing 100% NGPs was prepared by a well-known vacuum-assisted filtration procedure for making graphene paper which was also allowed to undergo the same heat treatment and roll-pressing procedures. The data clearly indicate that the approach of combining NGP and a carbon precursor led to dramatic synergism, having all thermal conductivity values drastically higher than those theoretically predicted based on the rule-of-mixture law. Further significantly and unexpectedly, some thermal conductivity values are higher than those of both the film derived from PBO alone (860 W/mK) and the film (paper) derived from graphene sheets alone (645 W/mK). With 60-90% NGP in the precursor composite film, the thermal conductivity values of the final graphitic films are above 860 W/mK, the better (higher) of the two. Quite interestingly, the neat PBO-derived graphitic films prepared under identical conditions exhibit a highest conductivity value of 860 W/mK, yet several combined NGP-PBO films, when carbonized and graphitized, exhibit thermal conductivity values of 924-1, 145 W/mK.

This surprisingly observed synergistic effect might be due to the notions that graphene sheets could promote graphitization of the carbonized precursor material (carbonized PBO in this example), and that the newly graphitized phase from PBO could help fill the gaps between otherwise separated discrete graphene sheets. Graphene sheets are themselves a highly graphitic material, better organized or graphitized than the graphitized polymer itself. Without the newly formed graphitic domains that bridge the gaps between graphene sheets, the transport of electrons and phonons would have been interrupted and would have resulted in lower conductivity. This is why the thin film paper made from NGPs alone exhibits a conductivity of only 645 W/mK.

Figure 5B:
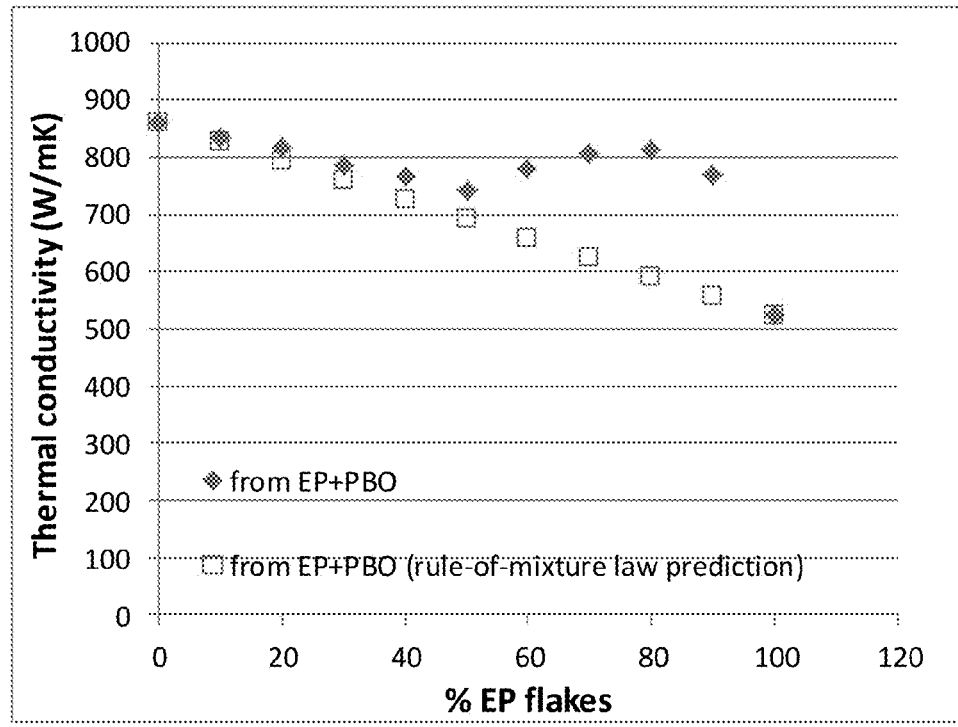
FIG. 5(B) The thermal conductivity values of a series of graphitic films derived from EP-PBO films of various weight fractions of NGPs; (C) Thermal conductivity comparison between graphitic films obtained from EP-PBO and NGP-PBO films.
Figure 5C:
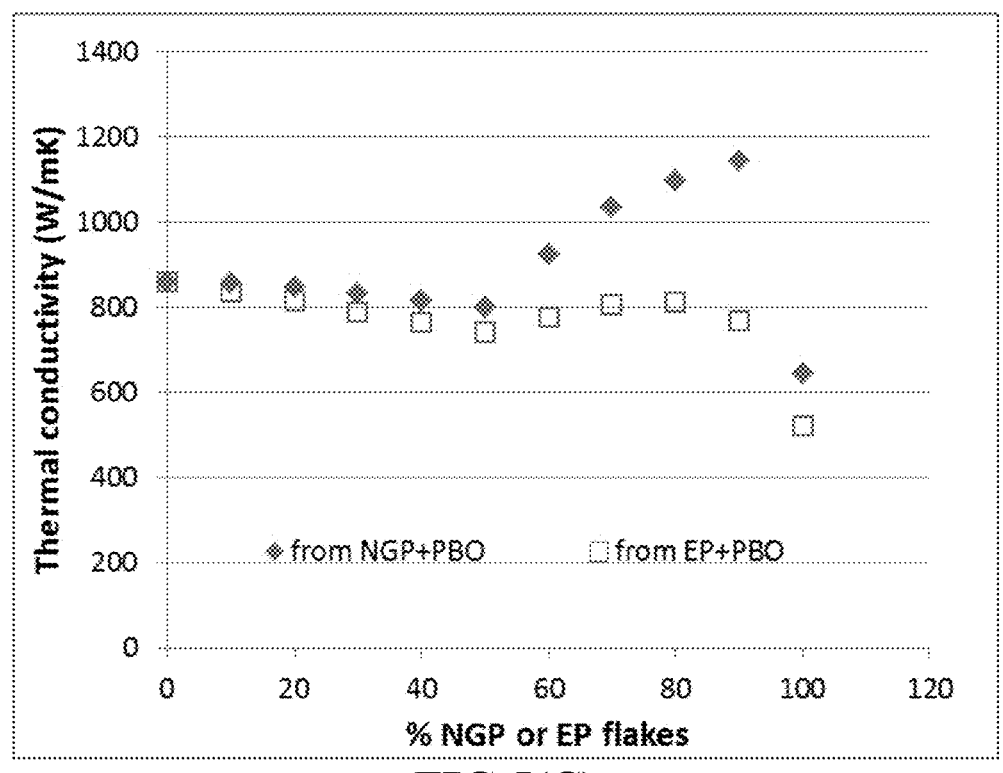

The thermal conductivity values of a series of graphitic films derived from EP-PBO films of various weight fractions of expanded graphite flakes (EP, from 0% to 100%) are summarized in FIG. 5(B). Also plotted therein is a curve of thermal conductivity ($K_c$) according to the predictions of a rule-of-mixture law. The data also show that the approach of combining expanded graphite and a carbon precursor has led to synergism, having all thermal conductivity values higher than the rule-of-mixture law predictions. However, as re-plotted in FIG. 5(C), these deviations from the theoretical predictions are not as dramatic as those in NGP-filled counterparts. This is quite surprising by itself since expanded graphite flakes (>100 nm in thickness) are actually quite graphitic, no less graphitic or organized than graphene sheets (typically 0.34-10 nm thick). This might be due to graphene sheets being more readily oriented during the film-forming procedure as compared to expanded graphite flakes. Additionally, graphene sheets might also be more effective than expanded graphite in promoting graphitization of the carbonized precursor material; e.g. being more effective heterogeneous nucleating sites for graphite crystals.

Example 5: Preparation of Polyimide (PI) Films, NGP-PI Films, and the Heat Treated Versions Thereof The synthesis of conventional polyimide (PI) involved poly(amic acid) (PAA, Sigma Aldrich) formed from pyromellitic dianhydride (PMDA) and oxydianiline (ODA). Prior to use, both chemicals were dried in a vacuum oven at room temperature. Next, 4 g of the monomer ODA was dissolved into 21 g of DMF solution (99.8 wt %). This solution was stored at 5° C. before use. PMDA (4.4 g) was added, and the mixture was stirred for 30 min using a magnetic bar. Subsequently, the clear and viscous polymer solution was separated into four samples.

Triethyl amine catalyst (TEA, Sigma Aldrich) with 0, 1, 3, and 5 wt % was then added into each sample to control the molecular weight. Stirring was maintained by a mechanical stirrer until the entire quantity of TEA was added. The as-synthesized PAA was kept at −5° C. to maintain properties essential for further processing.

Solvents utilized in the poly(amic acid) synthesis play a very important role. Common dipolar aprotic amide solvents utilized are DMF, DMAc, NMP and TMU. DMAc was utilized in the present study. The intermediate poly(amic acid) and NGP-PAA precursor composite were converted to the final polyimide by the thermal imidization route. Films were first cast on a glass substrate and then allowed to proceed through a thermal cycle with temperatures ranging from 100° C. to 350° C. The procedure entails heating the poly(amic acid) mixture to 100° C. and holding for one hour, heating from 100° C. to 200° C. and holding for one hour, heating from 200° C. to 300° C. and holding for one hour and slow cooling to room temperature from 300° C.

The PI films, pressed between two alumina plates, were heat-treated under a 3-sccm argon gas flow at 1000° C. This occurred in three steps: from room temperature to 600° C. in 1 h, from 600 to 1,000° C. in 1.3 h, and 1,000° C. maintained for 1 h.

Figure 6A:
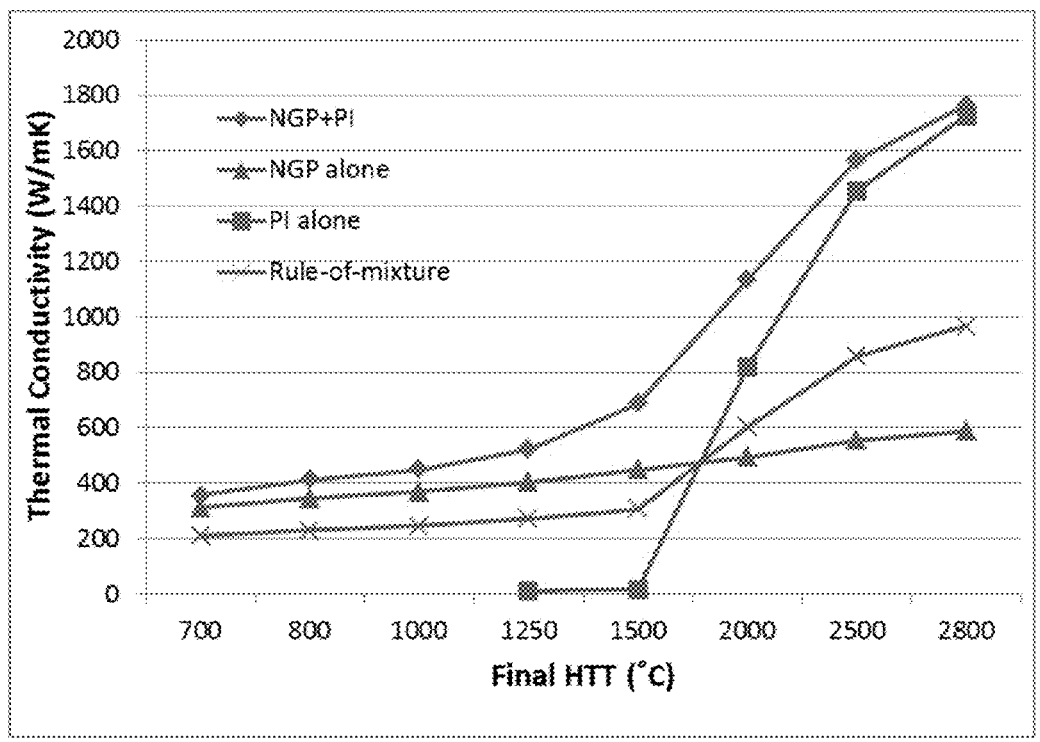
FIG. 6(A) Thermal conductivity.
Figure 6B:
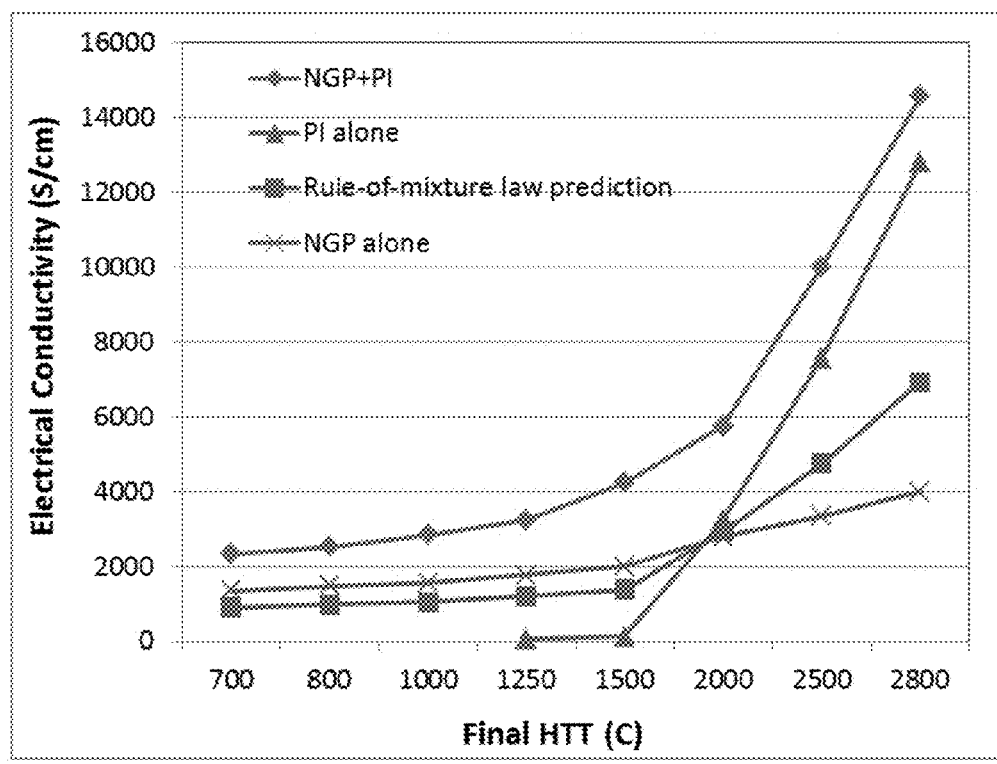
FIG. 6(B) electrical conductivity values of a series of graphitic films derived from NGP-PI films (66% NGP+34% PI), NGP paper alone, and PI film alone prepared at various final heat treatment temperatures.

The thermal conductivity and electrical conductivity values of a series of graphitic films derived from NGP-PI films (66% NGP+34% PI), NGP paper alone, and PI film alone each prepared at various final heat treatment temperatures are summarized in FIG. 6(A) and FIG. 6(B), respectively. Also plotted in each figure is a curve of thermal conductivity ($K_c$) or electrical conductivity curve according to the predictions of a rule-of-mixture law. The data also demonstrate that the approach of combining graphene sheets and a carbon precursor (PI) has led to synergism, having all thermal and electrical conductivity values higher than the rule-of-mixture law predictions.

Example 6: Preparation of Phenolic Resin Films, NGP-Phenolic Films, and their Heat-Treated Versions Phenol formaldehyde resins (PF) are synthetic polymers obtained by the reaction of phenol or substituted phenol with formaldehyde. The PF resin, alone or with 90% by weight NGPs or expanded graphite (EP) flakes, was made into 50-μm thick film and cured under identical curing conditions: a steady isothermal cure temperature at 100° C. for 2 hours and then eased from 100 to 170° C. and maintained at 170° C. to complete the curing reaction.

All the thin films were then carbonized at 500° C. for 2 hours and then at 700° C. for 3 hours. The carbonized films were then subjected to further heat treatments (additional carbonization and/or graphitization) at temperatures that were varied from 700 to 2,800° C. for 5 hours.

Figure 7A:
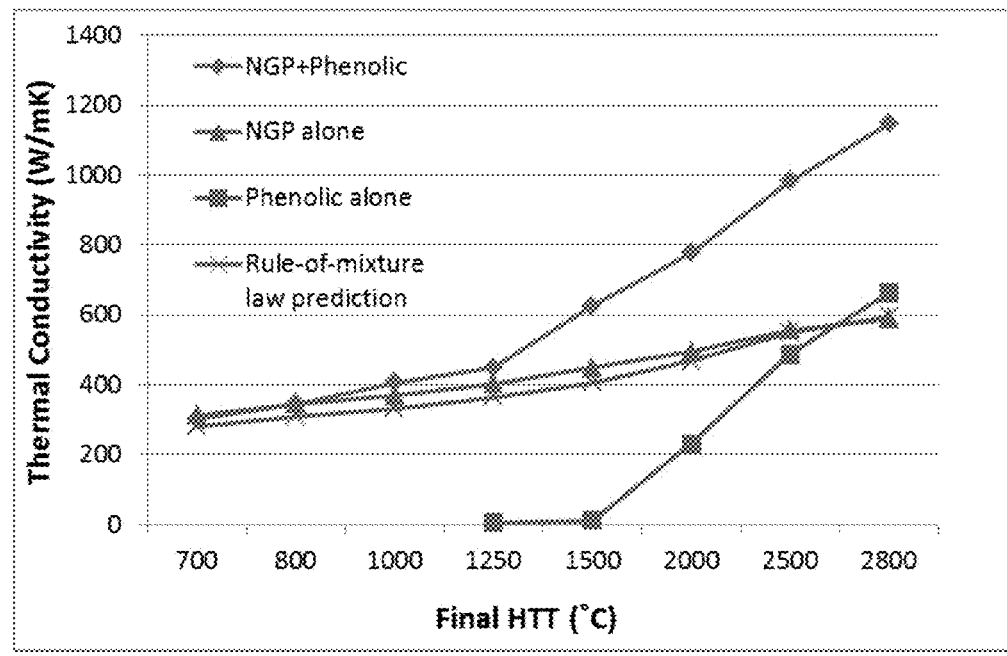
FIG. 7(A) The thermal conductivity values of a series of graphitic films derived from NGP-PF films (90% NGP+10% PF), NGP paper alone, and PF film alone prepared at various final heat treatment temperatures, along with a curve of thermal conductivity according to the predictions of a rule-of-mixture law.

The thermal conductivity values of a series of graphitic films derived from NGP-PF films (90% NGP+10% PF), NGP paper alone, and PF film alone prepared at various final heat treatment temperatures are summarized in FIG. 7(A). Also plotted therein is a curve of thermal conductivity ($K_c$) according to the predictions of a rule-of-mixture law. Again, the data show that the approach of combining graphene sheets and a carbon precursor (PF) has led to synergism, having all thermal conductivity values much higher than the rule-of-mixture law predictions.

Figure 7B:
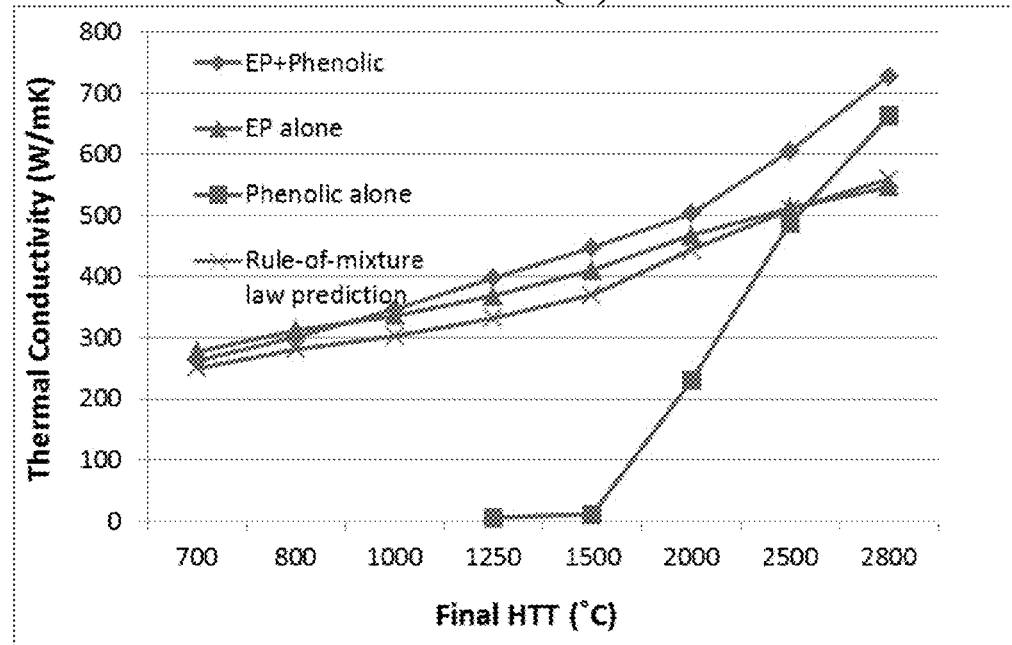
FIG. 7(B) those derived from EP-PF films (90% EP+10% PF), EP paper alone, PF film alone, and theoretical predictions.
Figure 7C:
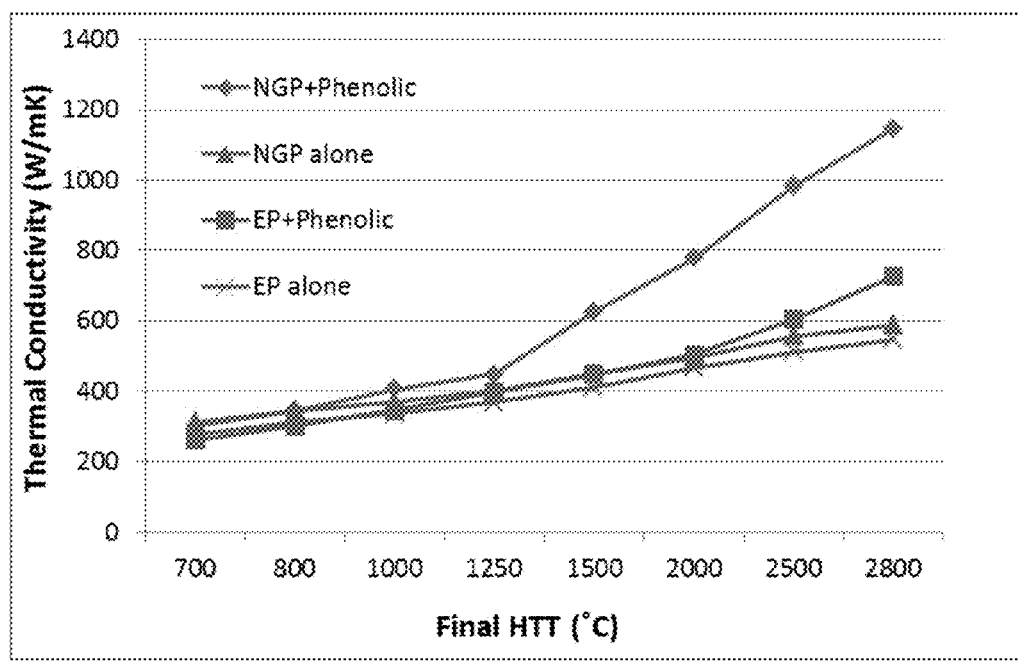
FIG. 7(C) a comparison between NGP-PF derived films and EP-PF derived films.

The thermal conductivity values of a series of graphitic films derived from EP-PF films (90% EP+10% PI), EP paper alone, and PF film alone prepared at various final heat treatment temperatures are summarized in FIG. 7(B). Also plotted therein is a curve of thermal conductivity ($K_c$) according to the predictions of a rule-of-mixture law. The data show that the approach of combining expanded graphite flakes and a carbon precursor (PF) has led to synergism, having all thermal conductivity values higher than the rule-of-mixture law predictions. However, as re-plotted in FIG. 7(C), these deviations from the theoretical predictions are not as dramatic as those in NGP-filled counterparts. Again, this is quite surprising by itself since expanded graphite flakes are actually quite graphitic, no less graphitic or organized than graphene sheets. This might be due to graphene sheets being more readily oriented during the film-forming procedure as compared to expanded graphite flakes. Additionally, graphene sheets might also be more effective than expanded graphite in promoting graphitization of the carbonized precursor material; e.g. being more effective heterogeneous nucleating sites for graphite crystals during graphitization of the carbonized resin.

Example 7: Preparation of Polybenzimidazole (PBI) Films and NGP-PBI Films

PBI is prepared by step-growth polymerization from 3,3',4,4'-tetraaminobiphenyl and diphenyl isophthalate (an ester of isophthalic acid and phenol). The PBI used in the present study was obtained from PBI Performance Products in a PBI solution form, which contains 0.7 dl/g PBI polymer dissolved in dimethylacetamide (DMAc). The PBI and NGP-PBI films were cast onto the surface of a glass substrate. The heat treatment and roll-pressing procedures were similar to those used in Example 4 for PBO.

Figure 8:
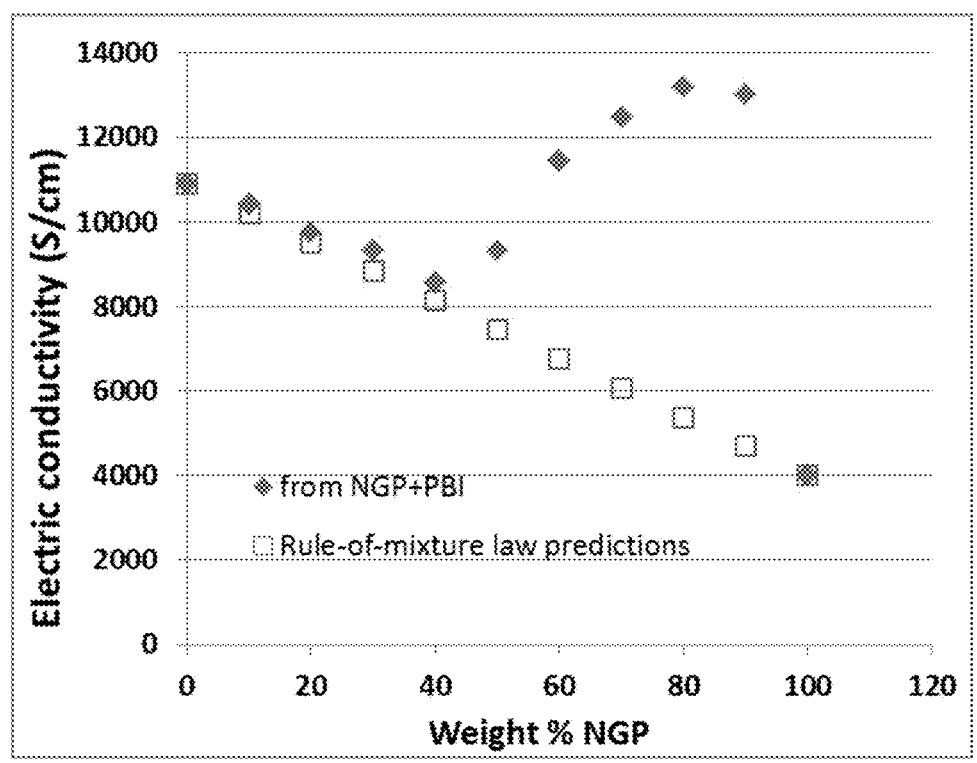
FIG. 8 The electric conductivity values of a series of graphitic films derived from NGP-PBI films of various weight fractions of NGPs (from 0% to 100%).

The electric conductivity values of a series of graphitic films derived from NGP-PBI films of various weight fractions of NGPs (from 0% to 100%) are summarized in FIG. 8. Also plotted therein is a curve of electric conductivity ($\sigma_c$) according to the predictions of a rule-of-mixture law commonly used to predict the property of a composite consisting of two components A and B having electric conductivity of $\sigma_A$ and $\sigma_B$, respectively:

$$\sigma_c = w_A \sigma_A + w_B \sigma_B,$$

Where $w_A$=weight fraction of component A and $w_B$=weight fraction of component B, and $w_A + w_B = 1$. In the present case, $w_B$=weight fraction of NGPs, varying from 0% to 100%. The sample containing 100% NGPs was prepared by a well-known vacuum-assisted filtration procedure for making graphene paper which also underwent the same heat treatment and roll-pressing procedures. The data clearly demonstrate that the approach of combining NGP and a carbon precursor led to dramatic synergism, having all electric conductivity values drastically higher than those theoretically predicted based on the rule-of-mixture law. Further unexpectedly, some electric conductivity values are higher than those of both the film derived from PBI alone (10,900 S/cm) and the paper derived from graphene sheets alone (3,997 S/cm). With 60-90% NGP in the precursor composite film, the electric conductivity values of the final graphitic films are above 10,900 S/cm, the better (higher) of the two. Quite interestingly, even though the neat PBI-derived graphitic films prepared under identical conditions exhibit a highest conductivity value of 10,900 S/cm, several combined NGP-PBI films, upon carbonization and graphitization, exhibit electric conductivity values of 11,450-13,210 S/cm.

This surprising synergistic effect is likely due to the notions that graphene sheets could promote graphitization of the carbonized precursor material (carbonized PBI in this example), and that the newly graphitized phase from PBI could help fill the gaps between otherwise separated discrete graphene sheets. Graphene sheets are themselves a highly graphitic material, better organized or graphitized than the graphitized polymer itself. Without the newly formed graphitic domains to bridge the gaps between graphene sheets, the transport of electrons would have been interrupted and would have resulted in lower conductivity. This is why the thin film paper made from NGPs alone exhibits an electric conductivity of only 3,997 S/cm.

Example 8: Graphitic Films from Various NGP-Modified Carbon Precursors

Additional graphitic films are prepared from several different types of precursor materials. Their electric and thermal conductivity values are listed in Table 1 below.

Example 9: Characterization of Graphitic Films

X-ray diffraction curves of a carbonized or graphitized material were monitored as a function of the heat treatment temperature and time. The peak at approximately $2\theta = 22\text{-}23°$ of an X-ray diffraction curve corresponds to an inter-graphene spacing ($d_{002}$) of approximately 0.3345 nm in natural graphite. With some heat treatment at a temperature>1,500° C. of a carbonized aromatic polymer, such as PI, PBI, and PBO, the material begins to see diffraction curves exhibiting a peak at $2\theta < 12°$. The angle $2\theta$ shifts to higher values when the graphitization temperature and/or time are increased. With a heat treatment temperature of 2,500° C. for 1-5 hours, the $d_{002}$ spacing typically is decreased to approximately 0.336 nm, close to 0.3354 nm of a graphite single crystal.

With a heat treatment temperature of 2,750° C. for 5 hours, the $d_{002}$ spacing is decreased to approximately to 0.3354 nm, identical to that of a graphite single crystal. In addition, a second diffraction peak with a high intensity appears at $2\theta = 55°$ corresponding to X-ray diffraction from (004) plane. The (004) peak intensity relative to the (002) intensity on the same diffraction curve, or the I(004)/I(002) ratio, is a good indication of the degree of crystal perfection and preferred orientation of graphene planes.

The (004) peak is either non-existing or relatively weak, with the I(004)/I(002) ratio<0.1, for all graphitic materials obtained from neat matrix polymers (containing no dispersed NGPs) heat treated at a final temperature lower than 2,800° C. For these materials, the I(004)/I(002) ratio for the graphitic materials obtained by heat treating at 3,000-3,250° C. is in the range of 0.2-0.5. In contrast, a graphitic film prepared from a NGP-PI film (90% NGP) with a HTT of 2,750° C. for 3 hours exhibits a I(004)/I(002) ratio of 0.78 and a Mosaic spread value of 0.21, indicating a practically perfect graphene single crystal with an exceptional degree of preferred orientation.

The "mosaic spread" value is obtained from the full width at half maximum of the (002) reflection in an X-ray diffraction intensity curve. This index for the degree of ordering characterizes the graphite or graphene crystal size (or grain size), amounts of grain boundaries and other defects, and the degree of preferred grain orientation. A nearly perfect single crystal of graphite is characterized by having a mosaic spread value of 0.2-0.4. Most of our NGP-PI derived materials have a mosaic spread value in this range of 0.2-0.4 (if obtained with a heat treatment temperature no less than 2,200° C.).

TABLE 1

Preparation conditions and properties of graphitic films from other precursor materials

| Sample No. | NGP or EP | Carbon Precursor | Carbonization temperature | Graphitization temperature | Electric conduc. (S/cm) | Thermal conduc. (W/mK) |
|---|---|---|---|---|---|---|
| 8-A | Pristine graphene, 80% | Petroleum pitch | 600-1000° C. | 2,300° C. | 8,300 | 950 |
| 8-B | none | Petroleum pitch | 600-1000° C. | 2,500 | 3,050 | 450 |
| 8-C | EP, 80% | Petroleum pitch | 600-1000° C. | 2,300 | 6,776 | 766 |
| 9-A | Reduced GO, 80% | Naphthalene | 600-1000° C. | 2,300 | 7,322 | 855 |
| 10-A | Fluorinated graphene, 50% | PAN | 230, 600, 1000° C. each 1 hr | 2,500 | 7,007 | 820 |
| 10-B | none | PAN | 230, 600, 1000° C. each 1 hr | 2,500 | 989 | 125 |
| 10-C | Fluorinated graphene paper | None | 230, 600, 1000° C. each 1 hr | 2,500 | 3,233 | 520 |

It may be noted that the I(004)/I(002) ratio for flexible graphite foil are typically <<0.05, practically non-existing in most cases. The I(004)/I(002) ratio for all NGP paper/membrane samples is <0.1 even after a heat treatment at 3,000° C. for 2 hours.

Scanning electron microscopy (SEM), transmission electron microscopy (TEM) pictures of lattice imaging of the graphene layer, as well as selected-area electron diffraction (SAD), bright field (BF), and dark-field (DF) images were also conducted to characterize the structure of various graphitic film materials. A close scrutiny and comparison of FIGS. 2(A), 3(A), and 3(B) indicates that the graphene layers in a graphitic film herein invented are substantially oriented parallel to one another; but this is not the case for flexible graphite foils and NGP paper. The inclination angles between two identifiable layers in the inventive graphitic films are mostly less than 5 degrees. In contrast, there are so many folded graphite flakes, kinks, and mis-orientations in flexible graphite that many of the angles between two graphite flakes are greater than 10 degrees, some as high as 45 degrees (FIG. 2(B)). Although not nearly as bad, the mis-orientations between graphene platelets in NGP paper (FIG. 3(B)) are also high and there are many gaps between platelets. Most significantly, the inventive graphitic films are essentially gap-free.

Examples 10: Tensile Strength of Various Graphitic Films

Figure 9:
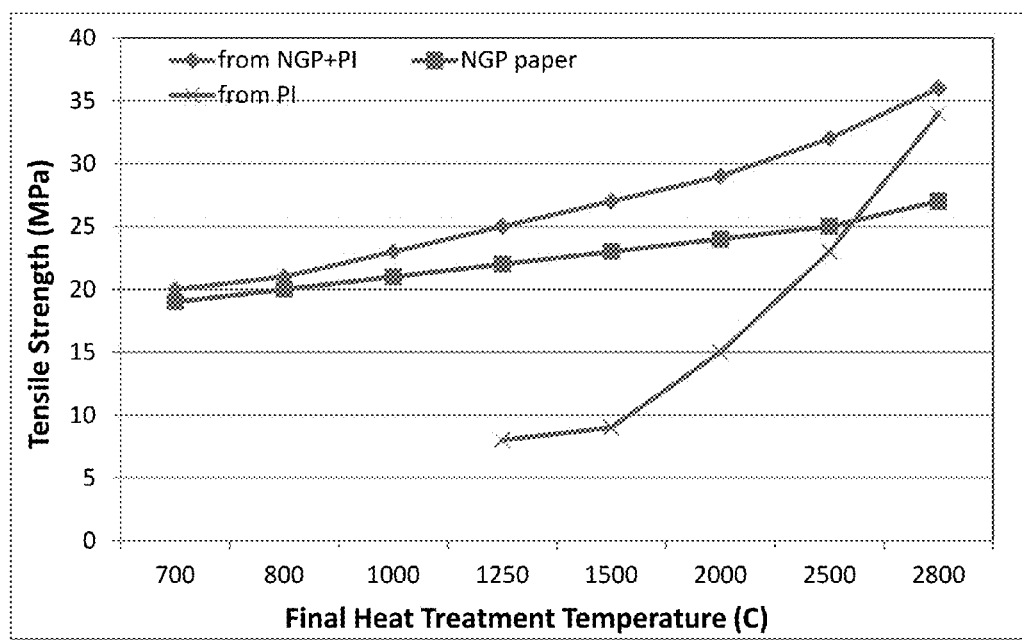
FIG. 9 The tensile strength values of NGP-PI derived films, PI-derived films, and NGP paper samples plotted as a function of the graphitization temperature.

A universal testing machine was used to determine the tensile strength of these materials. The tensile strength values of NGP-PI derived films, PI-derived films, and NGP paper samples are plotted as a function of the graphitization temperature, FIG. 9. These data demonstrate that the tensile strength of the PI film are very low (<<10 MPa) unless the final heat treatment temperature exceeds 2,000° C. The strength of the NGP paper increases slightly (from 19 to 27 MPa) when the heat treatment temperature increases from 700 to 2,800° C. In contrast, the tensile strength of the NGP-reinforced PI derived films increases significantly from 20 to 36 MPa over the same range of heat treatment temperatures.

In conclusion, we have successfully developed an absolutely new, novel, unexpected, and patently distinct process for producing highly conducting graphitic films. The thin films produced with this process have the best combination of excellent electrical conductivity, thermal conductivity, and mechanical strength.

We claim:

1. A graphene platelet-filled composite film comprising a carbon or graphitic matrix as a continuous phase and from 1% to 70% weight fraction of graphene platelets dispersed in said matrix, wherein said graphene platelets are aligned along planar directions of said film and are selected from pristine graphene, oxidized graphene, reduced graphene oxide, fluorinated graphene, hydrogenated graphene, doped graphene, chemically functionalized graphene, or a combination thereof, and wherein said carbon or graphitic matrix is obtained by carbonizing a carbon precursor polymer at a carbonization temperature of at least 300° C. or by carbonizing and graphitizing said carbon precursor polymer at a final graphitization temperature higher than 1,500° C., wherein said carbon precursor polymer is selected from the group consisting of polyimide, polyamide, polyoxadiazole, polybenzoxazole, polybenzobisoxazole, polythiazole, polybenzothiazole, polybenzobisthiazole, poly(p-phenylene vinylene), polybenzimidazole, polybenzobisimidazole, and combinations thereof; and said carbon or graphitic matrix comprises graphene layers, derived from said carbon precursor polymer, that are substantially oriented parallel to one another with an inclination angle between two graphene layers less than 5 degrees.

2. The graphene platelet-filled composite film of claim 1, wherein the graphene platelets comprise a single-layer graphene sheet or a multi-layer graphene platelet with a thickness less than 10 nm.

3. The graphene platelet-filled composite film of claim 1, wherein the graphene platelets comprise a multi-layer graphene platelet with a thickness less than 4 nm.

4. The graphene platelet-filled composite film of claim 1, wherein the graphene platelets comprise a single-layer pristine graphene sheet or a multi-layer pristine graphene platelet with a thickness less than 10 nm and said pristine graphene sheet or pristine graphene platelet contains no oxygen and is produced from a process that does not involve oxidation.

5. The graphene platelet-filled composite film of claim 1, wherein the graphene platelet-filled composite film has an inter-graphene spacing less than 0.338 nm, a thermal conductivity of at least 1,000 W/mK, and/or an electrical conductivity no less than 5,000 S/cm.

6. The graphene platelet-filled composite film of claim 1, wherein the graphene platelet-filled composite film has an inter-graphene spacing less than 0.337 nm, a thermal conductivity of at least 1,200 W/mK, an electrical conductivity no less than 7,000 S/cm, a physical density greater than 1.9 g/cm3, and/or a tensile strength greater than 30 MPa.

7. The graphene platelet-filled composite film of claim 1, wherein the graphene platelet-filled composite film has an inter-graphene spacing less than 0.336 nm, a thermal conductivity of at least 1,500 W/mK, an electrical conductivity no less than 10,000 S/cm, a physical density greater than 2.0 g/cm3, and/or a tensile strength greater than 35 MPa.

8. The graphene platelet-filled composite film of claim 1, wherein the graphene platelet-filled composite film exhibits an inter-graphene spacing less than 0.337 nm and a mosaic spread value less than 1.0.

9. The graphene platelet-filled composite film of claim 1, wherein the graphene platelet-filled composite film exhibits a degree of graphitization no less than 60% and/or a mosaic spread value less than 0.7.

10. The graphene platelet-filled composite film of claim 1, wherein the graphene platelet-filled composite film exhibits a degree of graphitization no less than 90% and/or a mosaic spread value less than 0.4.

11. The graphene platelet-filled composite film of claim 1, further comprising a filler selected from natural graphite, expanded graphite, artificial graphite, meso-phase carbon, meso-phase pitch, meso-carbon micro-bead, soft carbon, hard carbon, coke, carbon fiber, carbon nano-fiber, carbon nano-tube, or a combination thereof.

12. An electronic device containing the graphitic film of claim 1 as a heat-dissipating element therein.

* * * * *